(12) United States Patent
Yee et al.

(10) Patent No.: US 12,435,272 B2
(45) Date of Patent: Oct. 7, 2025

(54) METHODS OF FORMING NANOCRYSTALS AND RELATED CRYSTALS AND OPTOELECTRONIC DEVICES

(71) Applicant: The Government of the United States of America, as represented by the Secretary of the Navy, Arlington, VA (US)

(72) Inventors: Patrick Y. Yee, Washington, DC (US); Sarah F. Brittman, Washington, DC (US); Paul D. Cunningham, Baltimore, MD (US); Janice E. Boercker, Fairfax, VA (US); Katherine D. Burgess, Fairfax, VA (US); Rhonda M. Stroud, Scottsdale, AZ (US); Steven C. Erwin, Alexandria, VA (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 244 days.

(21) Appl. No.: 18/312,035

(22) Filed: May 4, 2023

(65) Prior Publication Data
US 2023/0332044 A1    Oct. 19, 2023

Related U.S. Application Data

(63) Continuation-in-part of application No. 17/238,265, filed on Apr. 23, 2021, now Pat. No. 11,732,186.
(Continued)

(51) Int. Cl.
C09K 11/66    (2006.01)
B82Y 20/00    (2011.01)
(Continued)

(52) U.S. Cl.
CPC ............ C09K 11/661 (2013.01); C09K 11/02 (2013.01); H10K 50/115 (2023.02); B82Y 20/00 (2013.01);
(Continued)

(58) Field of Classification Search
CPC .... C09K 11/661; C09K 11/02; H10K 50/115; C01P 2004/84; C01P 2004/64
See application file for complete search history.

(56) References Cited

U.S. PATENT DOCUMENTS 9,619,754 B2    4/2017    Gammon et al.
10,921,519 B2    2/2021    Grim et al.
(Continued)

FOREIGN PATENT DOCUMENTS

| KR | 20130031157 A | 3/2013 |
|---|---|---|
| KR | 101668480 B1 | 10/2016 |
| KR | 20170097296 | * 8/2017 |

OTHER PUBLICATIONS

Moreels, et al., "Size-Dependent Optical Properties of Colloidal PbS Quantum Dots", ACSNano, 2009, vol. 3, No. 10, p. 3023-3030.*
(Continued)

*Primary Examiner* — C Melissa Koslow
(74) *Attorney, Agent, or Firm* — US Naval Research Laboratory; Scott C. Hatfield

(57) ABSTRACT

Methods of fabricating nanocrystals are disclosed. Such methods may include providing copper sulfide core nanocrystals and providing a lead precursor. Moreover, the copper sulfide core nanocrystals may be reacted with the lead precursor to generate copper doped lead sulfide nanocrystals. Related nanocrystals and optoelectronic devices are also disclosed.

26 Claims, 16 Drawing Sheets

Related U.S. Application Data

(60) Provisional application No. 63/338,914, filed on May 6, 2022, provisional application No. 63/014,801, filed on Apr. 24, 2020.

(51) Int. Cl.
  B82Y 40/00 (2011.01)
  C09K 11/02 (2006.01)
  H10K 50/115 (2023.01)

(52) U.S. Cl.
  CPC ........... *B82Y 40/00* (2013.01); *C01P 2004/64* (2013.01); *C01P 2004/84* (2013.01)

(56) References Cited

U.S. PATENT DOCUMENTS

| | | |
|---|---|---|
| 11,150,495 B2 | 10/2021 | Grim et al. |
| 2021/0332291 A1 | 10/2021 | Boercker et al. |

OTHER PUBLICATIONS

Shkir et al., "Facilely synthesized Cu:PbS nanoparticles and thier structural, morphological, optical, dielectric and electrical studies for optoelectric applications", Materials Science in Semicondutor Processing, 96 (2019), 16-23, Feb. 22, 2019.*
K. E. Knowles, et al., "Luminescent Colloidal Semiconductor Nanocrystals Containing Copper: Synthesis, Photophysics, and Applications," Chem. Rev. 2016, 116, 18, USA, pp. 10820-10851.
L. You, et al., "Boosting the thermoelectric performance of PbSe through dynamic doping and hierarchical phonon scattering," Energy Environ. Sci 2018, 11, UK, pp. 1848-1858.
M. Li, "Room temperature aqueous-based synthesis of copper-doped lead sulfide nanoparticles for thermoelectric application," Chemical Engineering Journal, vol. 433, part 3, Apr. 2022, 133837, Netherlands, (10 pages).
B.Touati, et al., "Engineering of electronic and optical properties of PbS Thins films via Cu doping," Superlattices and Microstructures, vol. 97, Sep. 2016, USA, pp. 519-528.
H. Soetedjo, et al., "Deposition of Cu-doped PbS thin films with low resistivity using DC sputtering," Results in Physics 8, (2018), Netherlands, pp. 903-907.
M. Shkir, "Microwave-assisted synthesis of Cu doped PbS nanostructures with enhanced dielectric and electrical properties for optoelectronic applications," Materials Science & Engineering B 271, (2021) 115268, UK (9 pages).
P.Y. Yee, et al., "Cu2-xS/PbS Core/Shell Nanocrystals with Improved Chemical Stability," Chem. Mater. 2021, 33, USA, pp. 6685-6691.
I. Kriegel, et al., "Tuning the Excitonic and Plasmonic Properties of Copper Chalcogenide Nanocrystals," J. Amer. Chem. Soc. 2011, 3 (134), USA, pp. 1583-1590.
W. Byrks, et al., "Supramolecular Precursors for the Synthesis of Anisotropic Cu2S Nanocrystals," J. Am. Chem. Soc. 2014, 136, 17, USA, pp. 6175-6178.
G. Askelrod, et al., "Efficient Nanosecond Photoluminescence from Infrared PbS Quantum Dots Coupled to Plasmonic Nanoantennas," ACS Photonics 2016, 3, USA, pp. 1741-1746.
A. Litvin, et al., "Thin Layer of Semiconductor Plasmonic Nanocrystals for the Enhancement of NIR Fluorophores," J. Phys. Chem. C 2018, 122, 35, USA, pp. 20469-20475.
A. Litvin, et al., "Strong Enhancement of PbS Quantum Dot NIR Emission Using Plasmonic Semiconductor Nanocrystals in Nanoporous Silicate Matrix," Adv. Optical Mater. 2018, vol. 6, issue 6, Germany, 1701055 (7 pages).
D. Smith, et al., "Tuning the Synthesis of Ternary Lead Chalcogenide Quantum Dots by Balancing Precursor Reactivity," ACS Nano 2011, 5, 1, USA, pp. 183-190.
A. Stavrinadis, et al., "Heterovalent cation substitutional doping for quantum dot homojunction solar cells," Nature Communications 2013, 4, Article No. 2981, USA (7 pages).
B. Ji, et al., "Non-Blinking Quantum Dot With A Plasmonic Nanoshell Resonator," Nature nanotechnology, Feb. 2015, vol. 10, UK, pp. 170-175.
M. J. Turo, et al., "Crystal-Bound vs. Surface-Bound Thiols on Nanocrystals," ACS Nano 2014, vol. 8, No. 10, USA, pp. 10205-10213.
L. De Trizio, et al., "Forging Colloidal Nanostructures via Cation Exchange Reactions," Chemical Reviews, Feb. 18, 2016, 116 (18), USA, pp. 10852-10887.
X. Hwang, "Right Cu2-xS@MnS Core-Shell Nanoparticles as a Photo/H2O2-Responsive Platform for Effective Cancer Theranostics," Adv. Sci., 2019, 6, 1901461, Germany (12 pages).
T. Serrano, "One Pot Synthesis of PbS/Cu2S Core-Shell Nanoparticles," Rev. Mex. Fis. 60, Jan.-Feb. 2014, Mexico, pp. 14-21.
J. W. Stouwdam, et al., "Photostability of Colloidal PbSe and PbSe/PbS Core/Shell Nanocrystals in Solution and in the Solid State," J. Phys. Chem. C 2007, vol. 111, No. 3, USA, pp. 1086-1092.
E. M. Purcell, "Spontaneous emission probabilities at radio frequencies" Phys. Rev. 69, 681 (1946), USA, 1 page.
O. Kulakovich, et al., "Enhanced Luminescence of CdSe Quantum Dots on Gold Colloids," Nano Lett., vol. 2, No. 12, 2002, USA, pp. 1449-1452.
N. T. Fofang, et al., "Plexcitonic Nanoparticles: Plasmon-Exciton Coupling in Nanoshell-J-Aggregate Complexes," Nano Lett., vol. 8, No. 10, 2008, USA, pp. 3481-3487.
P. Reiss, et al., "Core/Shell Semiconductor Nanocrystals," Small 2009, 5, No. 2, Germany, pp. 154-168.
T. Kuzuya, et al., "Water-free Solution Synthesis of Monodisperse Cu2S Nanocrystals" Chemistry Letters (2004), vol. 33, No. 3, Japan, pp. 352-353.

\* cited by examiner

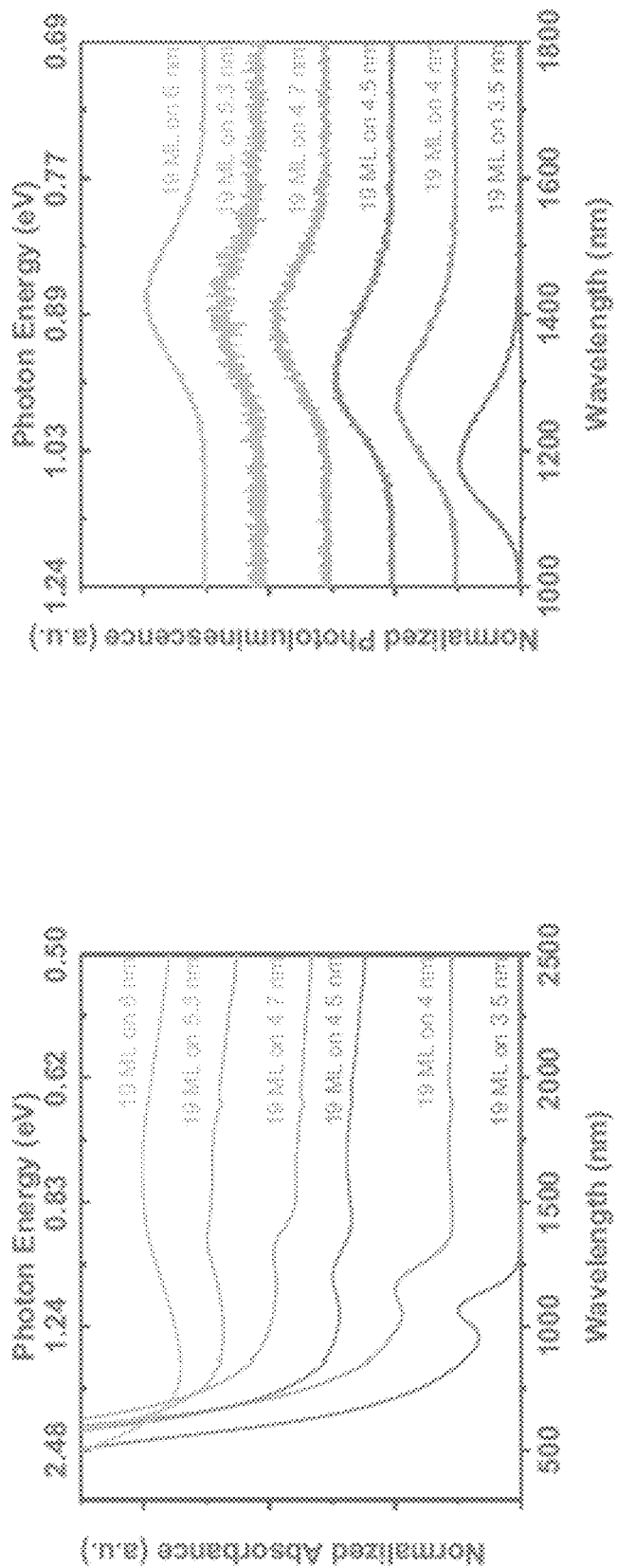
FIG. 12A
FIG. 12B
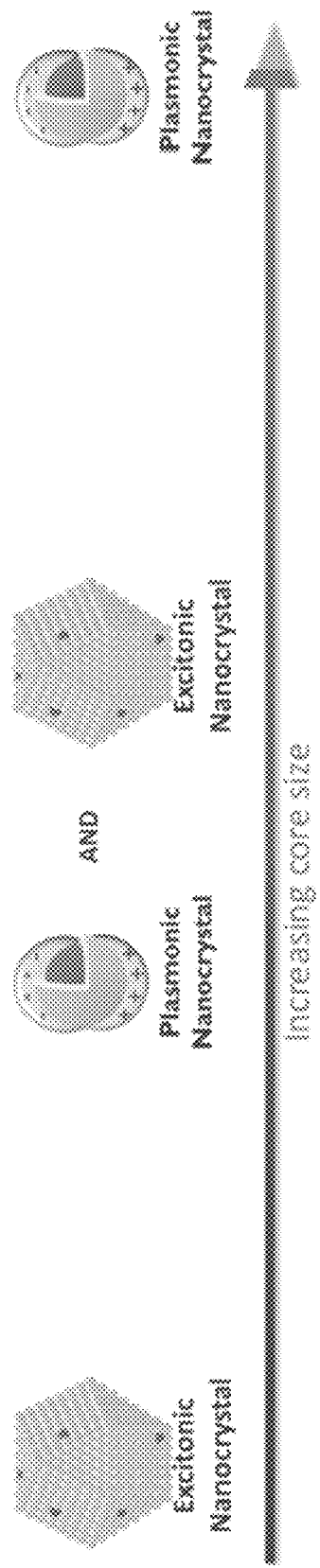
FIG. 13

METHODS OF FORMING NANOCRYSTALS AND RELATED CRYSTALS AND OPTOELECTRONIC DEVICES

CROSS-REFERENCE TO RELATED APPLICATIONS

This Application is a Nonprovisional Utility Patent Application and claims the benefit of priority under 35 U.S.C. Sec. 119 based on U.S. Provisional Patent Application No. 63/338,914 filed on May 6, 2022. This Nonprovisional Utility Patent Application also claims the benefit of priority under 35 U.S.C. Sec. 120 as a continuation-in-part based on U.S. patent application Ser. No. 17/238,265 filed on Apr. 23, 2021, now issued as U.S. Pat. No. 11,732,186, which claims the benefit of priority under 35 U.S.C. Sec. 119 based on U.S. Provisional Application No. 63/014,801 filed on Apr. 24, 2020. The disclosures of Provisional Application No. 63/338,914, Provisional Application No. 63/014,801, Nonprovisional application Ser. No. 17/238,265 (now issued as U.S. Pat. No. 11,732,186), and all references cited herein are hereby incorporated in their entirety by reference into the present disclosure.

FEDERALLY SPONSORED RESEARCH AND DEVELOPMENT

The U.S. Government has ownership rights in this invention. Licensing inquiries may be directed to Office of Technology Transfer, US Naval Research Laboratory, Code 1004, Washington, D.C. 20375, USA; +1.202.767.7230; techtran@nrl.navy.mil, referencing Navy Case #211054-US2.

TECHNICAL FIELD

The present disclosure relates to nanocrystals and more particularly to lead sulfide nanocrystals and related methods of fabrication.

BACKGROUND

Bulk Cu-doped semiconductors have been studied since the late 19th century and have been used for many applications. For example ZnS semiconductors doped with Cu+ as a primary dopant and Al3+ as a co-dopant were used as emitters in cathode ray tubes in the early 1950's for black and white televisions (TVs) and oscilloscopes. A Cu dopant in a semiconductor may thus redshift the emission as compared to the undoped semiconductor, and depending on the co-dopant type and the host crystal composition, the emission may be tuned throughout the visible region. Additionally, the redshift of the emission relative to the absorbance may lead to a large "effective Stoke shift" which lessens reabsorption and increases the efficiency of displays made using these materials.

More recently (e.g., from the 1980's to the present), Cu-doped II-VI and III-V semiconductor colloidal nanocrystals (such as CdS/Se/Te, ZnS/Se, and InP) have been explored. See, K. E. Knowles et al., "Luminescent Colloidal Semiconductor Nanocrystals Containing Copper: Synthesis, Photophysics, and Applications" Chem. Rev. 116, 10820 (2016). The emission lifetime in undoped colloidal II-VI and III-V semiconductor nanocrystals may be on the order of 10 ns, copper doping may increase the emission lifetime. The linewidth of the emission from Cu-doped nanocrystal semiconductors may be relatively large, on the order of 350 meV, due to electron-phonon coupling and differences in local environments of the Cu-dopants.

Notwithstanding the structures discussed above, there continues to exist a need in the art for crystal structures providing improved optical properties.

SUMMARY

This summary is intended to introduce in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

According to some embodiments of inventive concepts, methods of fabricating nanocrystals are provided. Such methods may include providing copper sulfide core nanocrystals and providing a lead precursor. Moreover, the copper sulfide core nanocrystals may be reacted with the lead precursor to generate copper doped lead sulfide nanocrystals. For example, the lead precursor may include lead oleate.

The method may also include providing a sulfur precursor, and reacting may include reacting the copper sulfide core nanocrystals, the sulfur precursor, and the lead precursor to generate the copper doped lead sulfide nanocrystals. For example, the sulfur precursor may include bis(trimethylsilyl)sulfide.

Reacting may include performing a cation exchange reaction to exchange the copper atoms in the copper sulfide core nanocrystals for the lead atoms of the lead precursor. Moreover, the cation exchange reaction may be performed using flash-injection synthesis to generate the copper doped lead sulfide nanocrystals.

Reacting may include reacting a first plurality of the copper sulfide core nanocrystals with the lead precursor to generate the copper doped lead sulfide nanocrystals and reacting a second plurality of the copper sulfide nanocrystals with the lead precursor to generate core/shell nanocrystals. Moreover, each of the core/shell nanocrystals may include a copper sulfide core and a lead sulfide shell surrounding the copper sulfide core. Moreover, the method may also include forming a superlattice including the copper doped lead sulfide nanocrystals and the core/shell nanocrystals.

The copper doped lead sulfide nanocrystals may have uniform concentrations of lead, sulfur, and copper throughout the copper doped lead sulfide nanocrystals. Moreover, the copper doped lead sulfide nanocrystals may have sizes in the range of about 4.5 nm to about 7.5 nm, the copper doped lead sulfide nanocrystals may have lattice constants in the range of about 5.95 Angstroms to about 5.99 Angstroms, the copper doped lead sulfide nanocrystals may have atomic ratios of Cu:Pb in the range of about 0.005 to about 0.045, and/or the copper doped lead sulfide nanocrystals may provide photon-emission with a wavelength in the range of about 1330 nm to about 1550 nm.

According to some other embodiments of inventive concepts, a copper doped lead sulfide crystal may provide photon-emission with a wavelength in the range of 1330 nm to 1550 nm.

The copper doped lead sulfide crystal may have uniform concentrations of lead, sulfur, and copper throughout the copper doped lead sulfide crystal. The copper doped lead sulfide crystal may be a copper doped lead sulfide nanocrystal having a size in the range of about 4.5 nm to about 7.5 nm. The copper doped lead sulfide crystal may have a lattice constant in the range of about 5.95 Angstroms to about 5.99 Angstroms. The copper doped lead sulfide crystal may have an atomic ratio of Cu:Pb in the range of about 0.005 to about 0.045.

According to still other embodiments of inventive concepts, an optoelectronic device may include a first electrode, a nanocrystal layer on the first electrode, and a second electrode on the nanocrystal layer so that the nanocrystal layer is between the first and second electrodes. Moreover, the nanocrystal layer may include copper doped lead sulfide nanocrystals.

The nanocrystal layer of the optoelectronic device may be a colloidal nanocrystal layer. In addition to the copper doped lead sulfide nanocrystals, the nanocrystal layer may also include core/shell nanocrystals, wherein each of the core/shell nanocrystals includes a copper sulfide core and a lead sulfide shell surrounding the copper sulfide core. Moreover, the nanocrystal layer may include a superlattice including the copper doped lead sulfide nanocrystals and the core/shell nanocrystals.

The copper doped lead sulfide nanocrystals of the optoelectronic device may have uniform concentrations of lead, sulfur, and copper throughout the copper doped lead sulfide nanocrystals. The copper doped lead sulfide nanocrystals may have sizes in the range of about 4.5 nm to about 7.5 nm. Moreover, the copper doped lead sulfide nanocrystals may have lattice constants in the range of about 5.95 Angstroms to about 5.99 Angstroms, the copper doped lead sulfide nanocrystals may have atomic ratios of Cu:Pb in the range of about 0.005 to about 0.045, and/or the copper doped lead sulfide nanocrystals may provide photon-emission with a wavelength in the range of about 1330 nm to about 1550 nm.

Moreover, the nanocrystal layer may be configured to emit light responsive to an electrical signal applied across the first and second electrodes, and/or the nanocrystal layer may be configured to generate an electrical signal across the first and second electrodes responsive to light incident on the nanocrystal layer.

BRIEF DESCRIPTION OF DRAWINGS

Examples of embodiments of inventive concepts may be more clearly understood from the following detailed description taken in conjunction with the accompanying drawings in which:

FIGS. 12A and 12B are graphs illustrating normalized absorbance and normalized photoluminescence as functions of wavelength for 19 ML reactions using different sizes of pre-made copper sulfide cores according to some embodiments of inventive concepts;

FIG. 13 is a diagram illustrating effects of copper sulfide core sizes on percentages of Cu-doped PbS nanocrystals and core/shell $Cu_{2-x}S$/PbS according to some embodiments of inventive concepts;

DETAILED DESCRIPTION

Figure 1A:
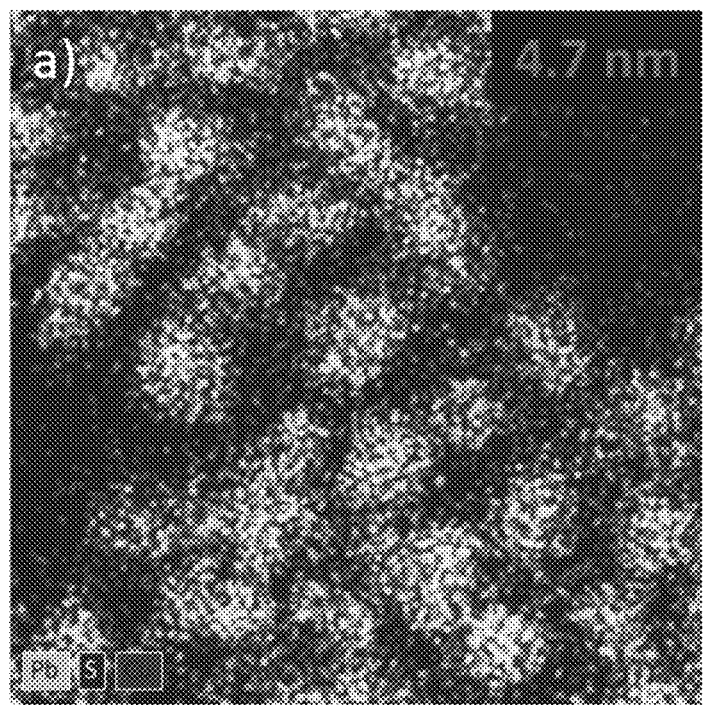
FIG. 1A is a STEM-EDS (scanning transmission electron microscope energy-dispersive X-ray spectroscopy) map of Cu-doped PbS nanocrystals made using a 19 ML precursor concentration on 3.5 nm copper sulfide $Cu_{2-x}S$ cores resulting in 4.7 nm Cu-doped nanocrystals with a Cu:Pb atomic ratio of 0.005 according to some embodiments of inventive concepts.

Aspects and features of the present disclosure will now be described more fully with reference to the accompanying drawings. The following description shows, by way of example, combinations and configurations in which aspects, features, and embodiments of inventive concepts can be put into practice. It will be understood that the disclosed aspects, features, and/or embodiments are merely examples, and that one skilled in the art may use other aspects, features, and/or embodiments or make functional and/or structural modifications without departing from the scope of the present disclosure.

According to some embodiments of present inventive concepts, the radiative rate of lead sulfide PbS nanocrystals may be increased by a factor of up to about 10 times, such that the PbS nanocrystals can be assembled at room-temperature to provide single-photon emitters operating at telecommunication wavelengths (e.g., in the range of 1330 nm to 1550 nm) for quantum technologies/devices having low/reduced size, low/reduced weight, low/reduced power, and/or low/reduced cost.

According to some embodiments of present inventive concepts, nanocrystal size and first exciton energy may be decoupled, such that more than one energy is possible for a particular size nanocrystal. This increased tunability of the absorption and/or emission energies may allow for novel/improved emissive and absorptive optoelectronic devices. For example, this increased tunability may allow for strong coupling between the nanocrystals and optical cavities which may require a particular nanocrystal size for improved/optimized performance. This may permit the construction of devices such as infrared detectors and/or displays having low/reduced size, low/reduced weight, low/reduced power, and/or low/reduced cost.

The present disclosure demonstrates methods used to synthesize copper doped (Cu-doped) lead sulfide (PbS) nanocrystals, and optical behavior of the Cu-dopants is shown to be strikingly different than what has been shown in II-VI and III-V semiconductor systems. First, the photoluminescence energy blue shifts rather than redshifts upon Cu-doping, which suggests that the Cu doping in PbS does not add an electronic state within the band gap, as it does in II-VI and III-V semiconductor materials, but rather increases the band gap. It is hypothesized that this increase is due to a Burstein-Moss Shift, and/or due to Cu well-hybridizing with band edge states, and/or due to Cu increasing the PbS lattice constant. Secondly, the emission lifetime of the Cu-doped PbS is in the range of 400 to 1000 ns which is longer than what has been measured in the II-VI and III-V semiconductor nanocrystals (i.e., in the range of 50 to 500 ns). However, as the PbS nanocrystals have an emission lifetime on the order of 1000-1200 ns, Cu-doping decreases the emission lifetime. Finally, the Stokes shifts and emission full width half maximum (fwhm) of these Cu-doped PbS nanocrystals are similar to the undoped PbS semiconductor nanocrystals. This is very different than what is seen in the II-VI and III-V semiconductor systems where the Stokes shifts and the emission fwhm are much larger in the Cu-doped nanocrystals as compared to the undoped nanocrystals.

These three differences between Cu-doped PbS nanocrystals and previously realized Cu-doped II-VI and III-V nanocrystals not only suggests discovery of a novel nanomaterial, but may also make Cu-doped PbS nanocrystals more attractive than undoped PbS for some optoelectronic applications. For example, the blue shifted emission resulting from Cu-doping may increase the emission tunability, which may be attractive for emissive and absorptive devices, and the increased radiative decay and narrow emission linewidth may make Cu-doped PbS nanocrystals brighter telecom single-photon emitters.

Synthesis of Cu-Doped PbS nanocrystals according to some embodiments of inventive concepts is discussed below.

Schlenk-line techniques are used unless otherwise noted. All purification steps are performed in a nitrogen-filled glovebox. The materials, synthesis of Pb-oleate, 6 nm copper sulfide $Cu_{2-x}S$ cores, and bis(trimethylsilyl)sulfide stock solution have been reported. See, P. Y. Yee et al., "$Cu_{2-x}S$/PbS Core/Shell Nanocrystals with Improved Chemical Stability," Chem. Mater. 33, 6685 (2021).

A small Kuzuya copper sulfide $Cu_{2-x}S$ Core Reaction is discussed below.

According to some embodiments of inventive concepts disclosed herein, copper sulfide may be represented as $Cu_{2-x}S$, where x may take any value from 0 to 1 (i.e., $0 \leq x \leq 1$). Accordingly, the formulation $Cu_{2-x}S$ is intended to cover stoichiometric compositions of copper sulfide nanocrystals including $Cu^{+2}S$ (covellite) and $Cu^{+}_2S$ (chalcocite), as well as non-stoichiometric compositions of copper sulfide nanocrystals where x has a non-integer value between 0 and 1 (e.g., $Cu_{1.98}S$). Use of the formulation $Cu_{2-x}S$ to represent copper sulfide is discussed, for example, in: Michael J Turo et al., "Crystal-Bound vs. Surface-Bound Thiols on Nanocrystals," ACS Nano 2014, vol. 8, no. 10, 10205-10213; L. De Trizio et al., "Forging Colloidal Nanostructures via Cation Exchange Reactions," Chemical Reviews 2016, 116 (18) 10852-10887; Hwang, "Right $Cu_{2-x}S$@MnS Core-Shell Nanoparticles as a Photo/H2O2-Responsive Platform for Effective Cancer Theranostics," Adv. Sci. 2019, 6, 1901461 (1 of 12); and Serrano, "One Pot Synthesis of PbS/Cu2S Core-Shell Nanoparticles," Rev. Mex. Fis. 60 (2014) 14-21.

Differently sized copper sulfide $Cu_{2-x}S$ cores were made using a method as reported by Kuzuya et al. See, T Kuzuya, "Water-free Solution Synthesis of Monodisperse $Cu_2S$ Nanocrystals," Chemistry Letters 33, 352 (2004). For 3.5 nm $Cu_{2-x}S$ cores, 0.175 g of copper (II) acetylacetonate was combined with 1.7 mL of 1-dodecanethiol and diluted, while stirring (1150 rpm), with 141.7 mL of dioctyl ether in a 250 mL, three-necked, round bottom flask. The flask was then put under vacuum for 30 minutes at room temperature and afterward switched to argon flow. To avoid degassing uncontrollably, the vacuum line may/must be opened to the flask very gradually, without initial stirring, as the polar solvents may contain a lot of water.

Under argon, the mixture was heated (initial rate ~8° C./minute to 200° C. and then ~1.3° C./minute to 217° C., although the second ramp was asymptotic rather than linear) to 217° C. At 214° C., the mixture turned black and was reacted for an additional 13 minutes, starting at the color change to black. After 13 minutes, the flask was removed from heat and quenched in liquid nitrogen $N_2$ to room temperature. The mixture was then transferred into a nitrogen $N_2$ glovebox, and split into twelve centrifuge tubes.

24 mL of anhydrous ethanol was added to each tube and subsequently centrifuged at 6000 rpm for 5 minutes. The supernatant was then decanted, and each precipitate was split into 4 centrifuge tubes using 6 mL of anhydrous hexane. 12 mL of anhydrous ethanol was added to each tube and subsequently centrifuged at 6000 rpm for 5 minutes. The precipitate, which has the $Cu_{2-x}S$ cores and insoluble Cu-alkanethiolate $CuSC_{12}H_{25}$ (see, W. Bryks et al., "Supramolecular Precursors for the Synthesis of Anisotropic $Cu_2S$ Nanocrystals," J. Am. Chem. Soc. 136, 6175 (2014)), was then suspended in 3 mL of anhydrous hexane and subsequently centrifuged at 6000 rpm for 2 minutes. The supernatant should contain primarily/only extracted copper sulfide $Cu_{2-x}S$ cores. This extraction process is repeated 3 times and all of the $Cu_{2-x}S$-containing supernatants were combined, and the volume was reduced to 0.5 mL. 36 mL of anhydrous ethanol was added and subsequently centrifuged at 6000 rpm for 2 minutes. The remaining, cleaned $Cu_{2-x}S$ was dried completely and was resuspended in hexane to create a 10.6 mg/mL solution.

A Pb Cation Exchange Reaction is discussed below.

The Cu-doped PbS nanocrystals were made according to reported synthesis of $Cu_{2-x}S$/PbS core/shell nanocrystals with slight modifications to the size of the copper sulfide $Cu_{2-x}S$ cores used and lead Pb and sulfur S precursor concentrations. See, P. Y. Yee et al., "$Cu_{2-x}S$/PbS Core/Shell Nanocrystals with Improved Chemical Stability" Chem. Mater. 33, 6685 (2021). Precursor concentrations were decided based on varying theoretical numbers of lead sulfide PbS monolayers (ML) added to the copper sulfide $Cu_{2-x}S$ cores. The definition of an added "theoretical ML" in this case is taken to be the addition of a complete layer of lead Pb or sulfur S atoms added to the surface and is estimated as a diameter change of 5.932 A, or a shell thickness of 2.966 A, which is the (200) d-spacing of rock-salt PbS. The initial core volume was calculated based on the starting $Cu_{2-x}S$ core diameter (3.5 nm) and sample weight (including the ligands). A shell volume of a given ML thickness was then calculated and used to determine the number of moles of Pb and S need. Note that the increased Pb and S required per ML as the shell grew was accounted for. The Pb-oleate to bis(trimethylsilyl)sulfide ratio should/must be 1.5. If the ratio is 1, then the reaction product may become insoluble. The concentration of Pb-oleate and bis(trimethylsilyl)sulfide was set such that if all of the bis(trimethylsilyl)sulfide were to react and deposit PbS on the copper sulfide $Cu_{2-x}S$ core, a PbS shell of the desired number of monolayers thick would form.

Figure 7:
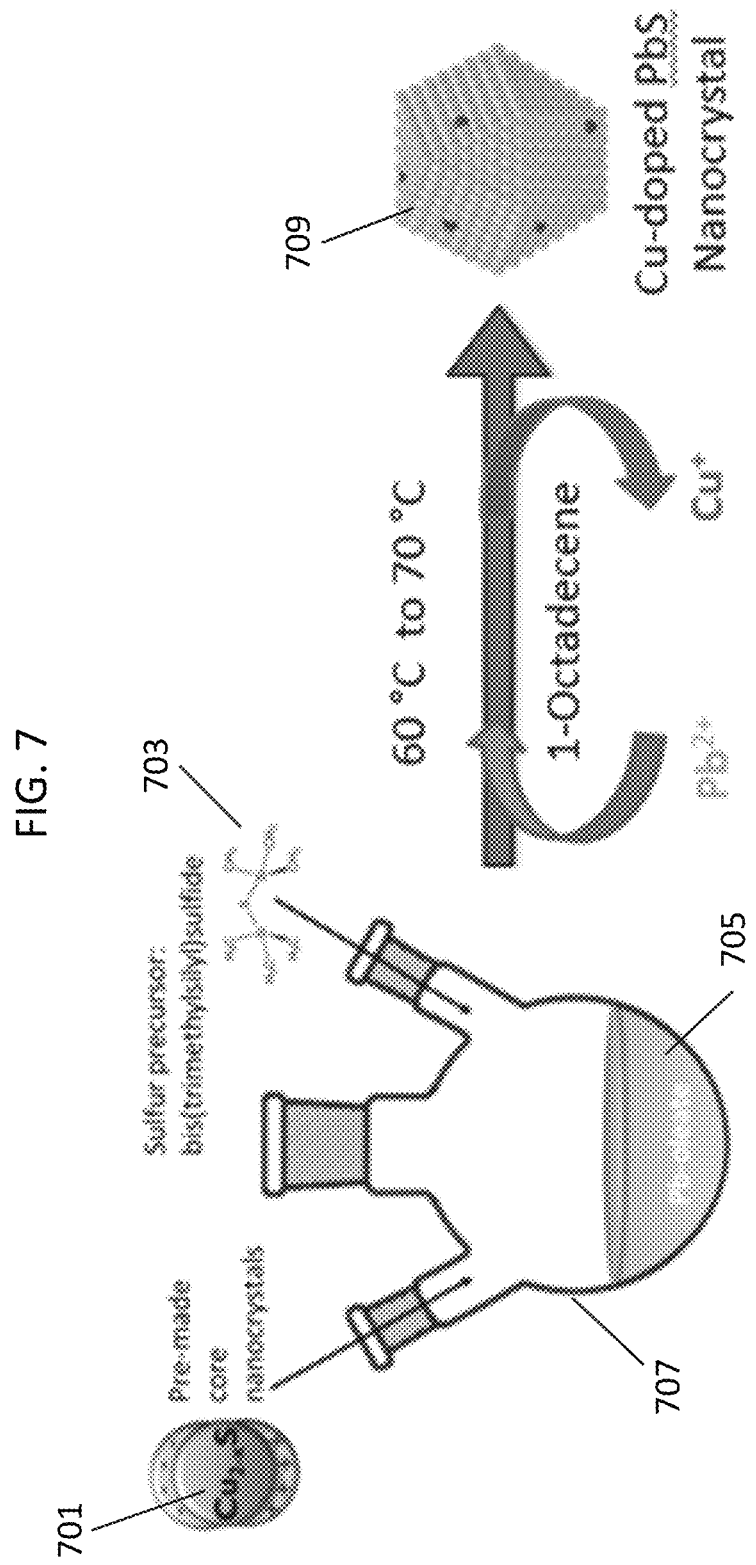
FIG. 7 illustrates formation of Cu-doped lead sulfide semiconductor nanocrystals using flash-injection synthesis according to some embodiments of inventive concepts.

Formation of Cu-doped lead sulfide semiconductor nanocrystals using flash-injection synthesis is discussed with respect to FIG. 7 according to some embodiments of inventive concepts. As shown in FIG. 7, previously made copper sulfide $Cu_{2-x}S$ nanocrystal cores 701 and a sulfur precursor 703 (e.g., bis(trimethylsilyl)sulfide) are added to and/or combined with a lead precursor 705 (e.g., including Pb-oleate dissolved in 1-Octadecene) in a three-necked, round bottom flask 707, and these additions are performed in a nitrogen $N_2$ environment (e.g., in a nitrogen $N_2$ glovebox) at a temperature in the range of about 60° C. to about 70° C. to provide Cu-doped PbS nanocrystals 709. With a sufficiently high concentration/mass of lead in the lead precursor (i.e., a high lead Pb reaction), the reaction may yield Cu-doped lead sulfide nanocrystals according to some embodiments of inventive concepts. Reaction concentrations/masses of lead Pb in the lead precursor and/or sulfur S in the sulfur precursor may be based on a theoretical number of monolayers (MLs) of PbS shells added to the surface of each copper sulfide nanocrystal core (e.g., each lead Pb and/or sulfur S atomic layer added to the surface of a copper sulfide nanocrystal core). Examples for 19 monolayer ML, 15 monolayer ML, and 21 monolayer ML reactions are discussed below. Adjustment to the concentration ranges and reaction temperatures may enable the cation exchange to proceed and may yield controllable Cu-doping of the resulting Cu-doped PbS nanocrystals.

According to some embodiments of inventive concepts, the reaction of FIG. 7 may result in excitonic Cu-doped PbS nanocrystals and plasmonic copper sulfide $Cu_{2-x}S$ nanocrystals, and the resulting excitonic Cu-doped PbS nanocrystals and plasmonic copper sulfide $Cu_{2-x}S$ nanocrystals can be used to provide a binary superlattice for optoelectronic applications as discussed below with respect to FIGS. 8 and 9.

If the concentration of lead in the lead precursor is insufficient (i.e., a low lead Pb reaction), lead sulfide shells may be formed on respective copper sulfide nanocrystals as discussed in U.S. Patent Publication No. 2021/0332291 without forming Cu-doped PbS nanocrystals. Moreover, Cu-doped lead sulfide PbS may not result when only a Cu precursor is added to the PbS synthesis (without copper sulfide nanocrystals).

Figure 8A:
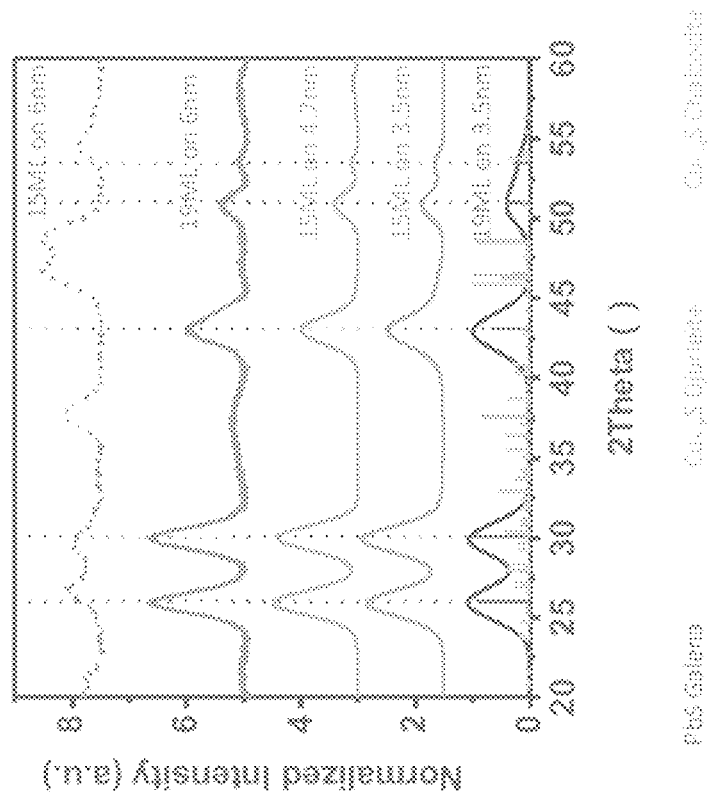
FIG. 8A is a graph illustrating normalized absorbance as a function of wavelength for a 19 ML reaction using 3.5 nm copper sulfide cores, a 15 ML reaction using 3.5 nm copper sulfide cores, a 15 ML reaction using 4.7 nm copper sulfide cores, and a 19 ML reaction using 6 nm cores according to some embodiments of inventive concepts.
Figure 8B:
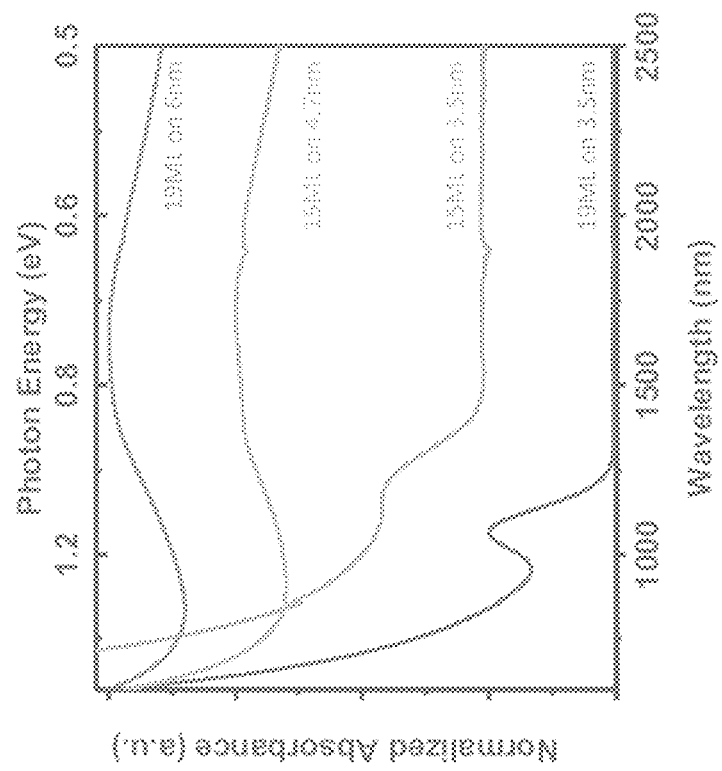
FIG. 8B is a graph illustrating X-ray diffraction patterns collected from a 19 ML reaction using 3.5 nm copper sulfide cores according to some embodiments of inventive concepts, a 15 ML reaction using 3.5 nm copper sulfide cores according to some embodiments of inventive concepts, a 15 ML reaction using 4.7 nm copper sulfide cores according to some embodiments of inventive concepts, a 19 ML reaction using 6 nm cores according to some embodiments of inventive concepts, and a 15 ML reaction using 6 nm copper sulfide cores.

The ratio of populations of core/shell nanocrystals (copper sulfide cores and PbS shells) to Cu-doped PbS nanocrystals resulting from the reaction discussed above with respect to FIG. 7 may be controlled using different sizes of the pre-made copper sulfide cores 701 and using different lead precursor concentrations. FIG. 8A is a graph illustrating normalized absorbance as a function of wavelength for: a 19 ML reaction using 3.5 nm copper sulfide cores; a 15 ML reaction using 3.5 nm copper sulfide cores; a 15 ML reaction using 4.7 nm copper sulfide cores; and a 19 ML reaction using 6 nm cores. FIG. 8B is a graph illustrating X-ray diffraction patterns collected from a 19 ML reaction using 3.5 nm copper sulfide cores, a 15 ML reaction using 3.5 nm copper sulfide cores, a 15 ML reaction using 4.7 nm copper sulfide cores, a 19 ML reaction using 6 nm cores, and a 15 ML reaction using 6 nm copper sulfide cores. Reactions using higher lead precursor concentrations and/or smaller copper sulfide cores may result in a higher percentage of excitonic Cu-doped PbS nanocrystals and a lower percentage of plasmonic core/shell $Cu_{2-x}S/PbS$ nanocrystals. Reactions using lower lead precursor concentrations and/or larger copper sulfide cores may result in a lower percentage of excitonic Cu-doped PbS nanocrystals and a higher percentage of plasmonic core/shell $Cu_{2-x}S/PbS$ nanocrystals.

Figure 9B:
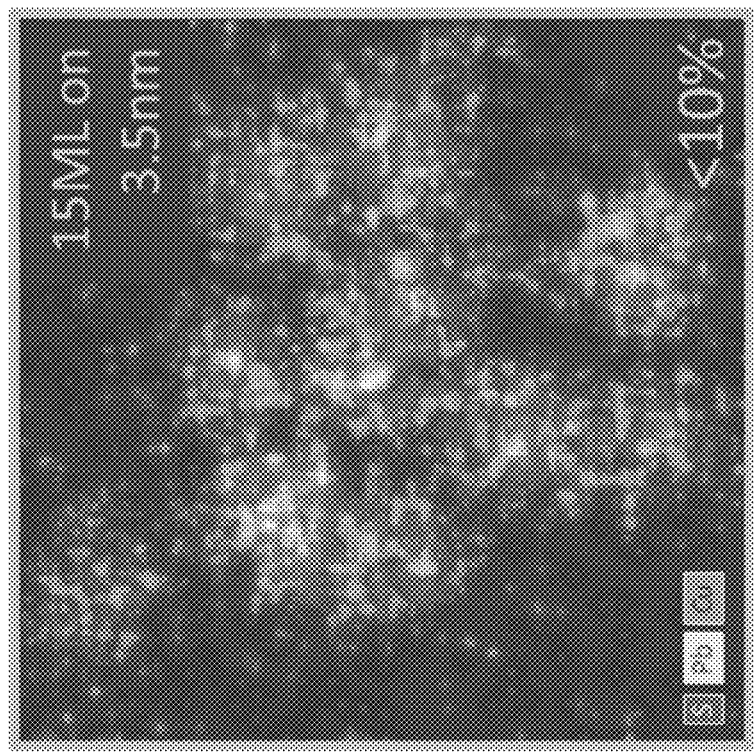
FIG. 9B is a STEM-EDS map of a result of the 15 ML reaction using 3.5 nm copper sulfide cores according to some embodiments of inventive concepts.
Figure 9A:
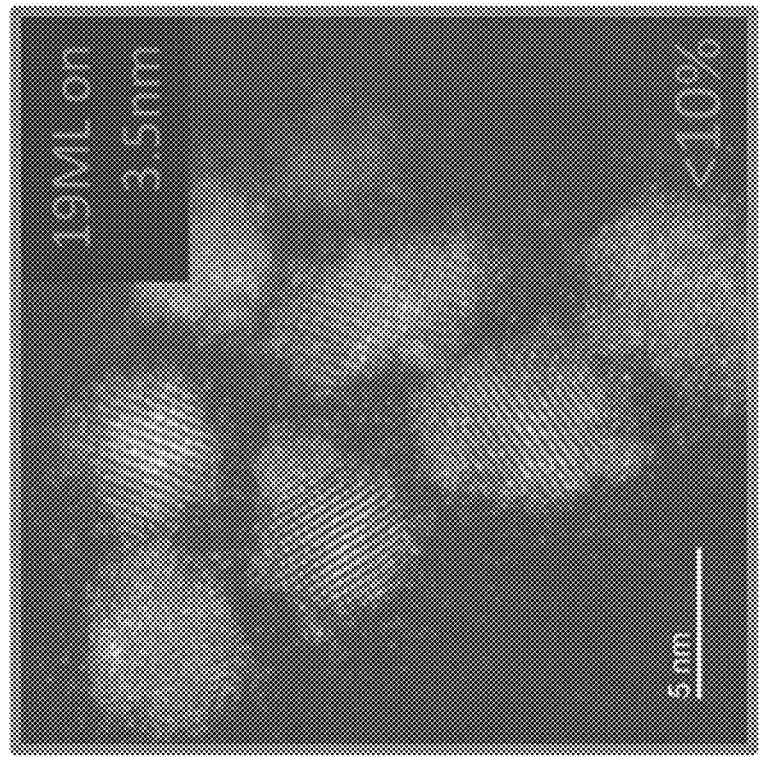
FIG. 9A is a STEM-HAADF micrograph of a result of the 19 ML reaction using 3.5 nm copper sulfide cores according to some embodiments of inventive concepts.
Figure 9D:
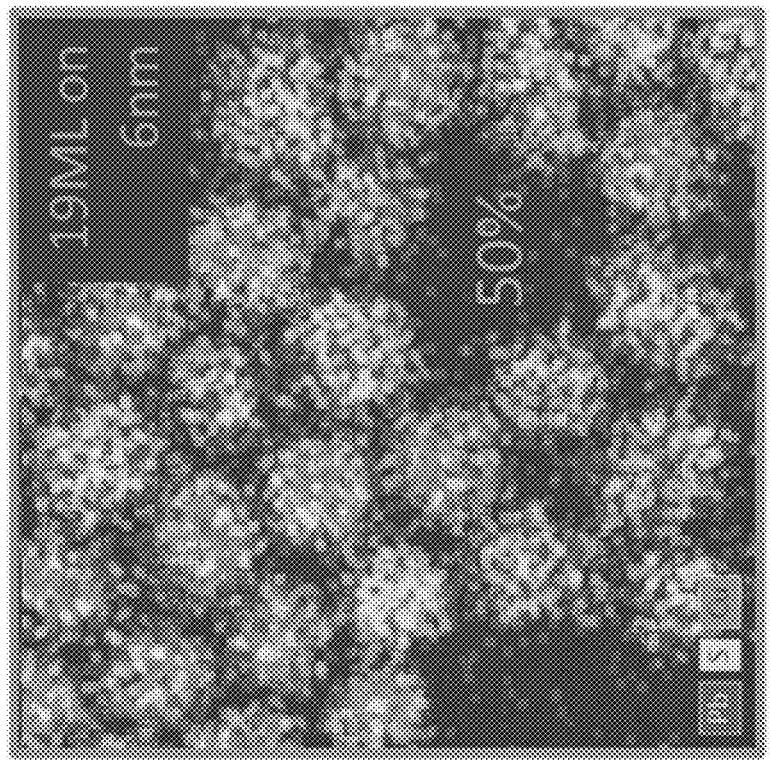
FIG. 9D is a STEM-EDS map of a result of the 19 ML reaction using 6.0 nm pre-made copper sulfide cores according to some embodiments of inventive concepts.
Figure 9C:
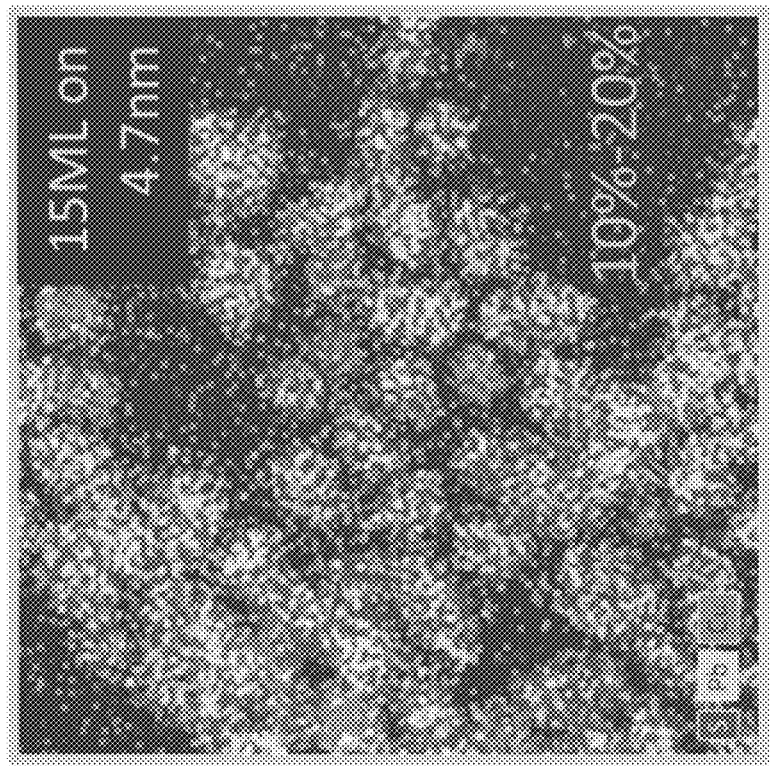
FIG. 9C is a STEM-EDS map of a result of the 15 ML reaction using 4.7 nm copper sulfide cores according to some embodiments of inventive concepts.

FIG. 9A is a STEM-HAADF (high-angle annular darkfield) micrograph of a result of the 19 ML reaction using 3.5 nm copper sulfide cores where the resulting copper sulfide nanocrystal to Cu-doped PbS nanocrystal population percentage is less than about 10%. FIG. 9B is a STEM-EDS map of a result of the 15 ML reaction using 3.5 nm copper sulfide cores where the resulting copper sulfide nanocrystal to Cu-doped PbS nanocrystal population percentage is less than about 10%. FIG. 9C is a STEM-EDS map of a result of the 15 ML reaction using 4.7 nm copper sulfide cores where the resulting copper sulfide nanocrystal to Cu-doped PbS nanocrystal population percentage is in the range of about 10% to about 20%. FIG. 9D is a STEM-EDS map of a result of the 19 ML reaction using 6.0 nm pre-made copper sulfide cores where the resulting copper sulfide nanocrystal to Cu-doped PbS nanocrystal population percentage is about 50%.

Figure 10A:
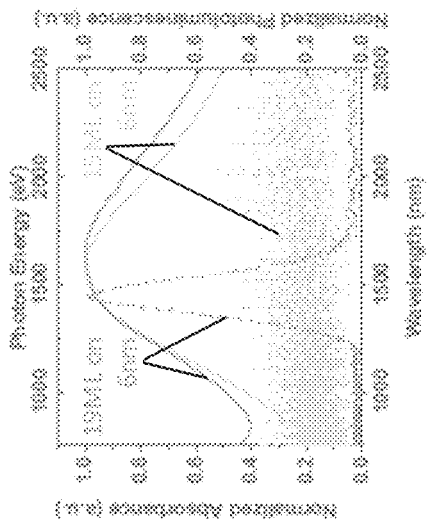
FIGS. 10A, 10B, and 10C are graphs illustrating normalized absorbance and normalized photoluminescence as functions of wavelength for different lead precursor (e.g., Pb-oleate) and sulfur precursor (bis(trimethylsilyl)sulfide) concentrations and different initial copper sulfate core sizes according to some embodiments of inventive concepts.
Figure 10B:
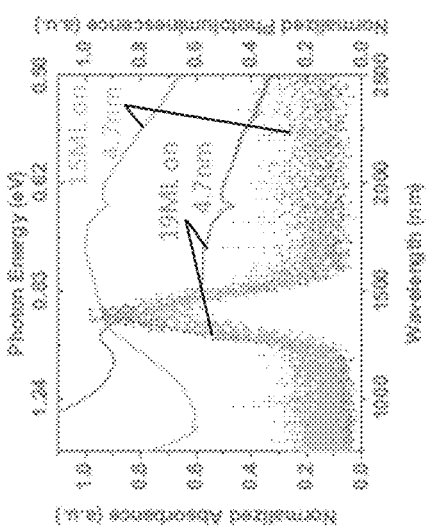
Figure 10C:
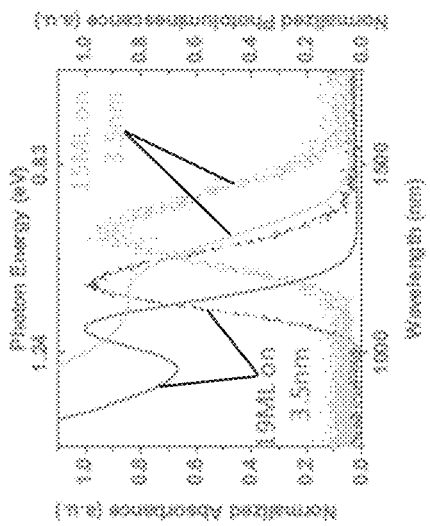
Figure 11:
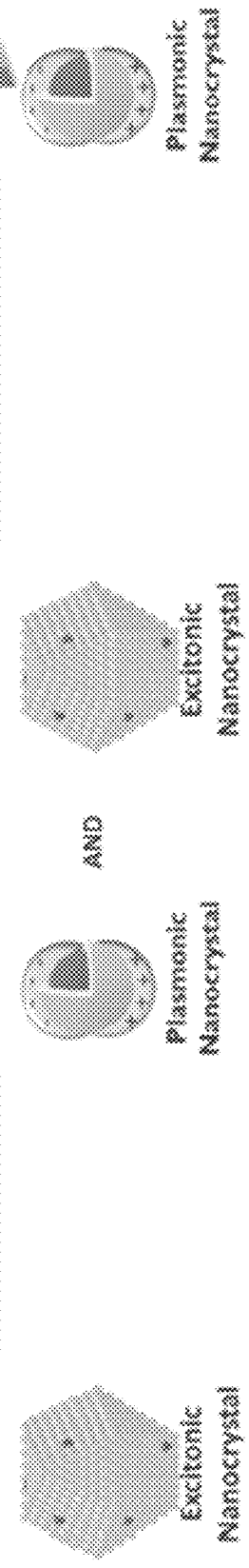
FIG. 11 is a diagram illustrating effects of lead precursor concentration on percentages of Cu-doped PbS nanocrystals and core/shell $Cu_{2-x}S$/PbS nanocrystals according to some embodiments of inventive concepts.

Relative populations of nanocrystals (i.e., percentages of Cu-doped PbS nanocrystals and percentages of core/shell $Cu_{2-x}S/PbS$ nanocrystals) may be controlled by controlling lead Pb precursor concentrations. FIGS. 10A, 10B, and 10C are graphs illustrating normalized absorbance and normalized photoluminescence as functions of wavelength for different lead precursor (e.g., Pb-oleate) concentrations and initial copper sulfate core sizes. FIG. 10A illustrates absorbance and photoluminescence for 19 ML and 15 ML reactions using 3.5 nm pre-made copper sulfate cores. FIG. 10B illustrates absorbance and photoluminescence for 19 ML and 15 ML reactions using 4.7 nm pre-made copper sulfate cores. FIG. 10C illustrates absorbance and photoluminescence for 19 ML and 15 ML reactions using 6.0 nm pre-made copper sulfate cores. In each case, a reduction in concentration of the lead precursor (Pb-oleate) results in a reduced percentage of Cu-doped PbS nanocrystals and an increased percentage of core/shell $Cu_{2-x}S/PbS$ (with copper sulfide shell and lead sulfide shell) nanocrystals as shown in FIG. 11.

Exciton energy can be controlled by using different sizes of pre-made copper sulfide cores. FIGS. 12A and 12B illustrate normalized absorbance and normalized photoluminescence as functions of wavelength for 19 ML reactions using different sizes of pre-made copper sulfide cores. As shown, both absorbance and photoluminescence increase with increased size of pre-made copper sulfide cores used for the reactions. FIG. 13 shows that increasing the size of the pre-made copper sulfide cores reduces the percentage of Cu-doped PbS nanocrystals and increases the percentage of core/shell $Cu_{2-x}S/PbS$ (with copper sulfide core and lead sulfide shell) nanocrystals.

Figure 14:
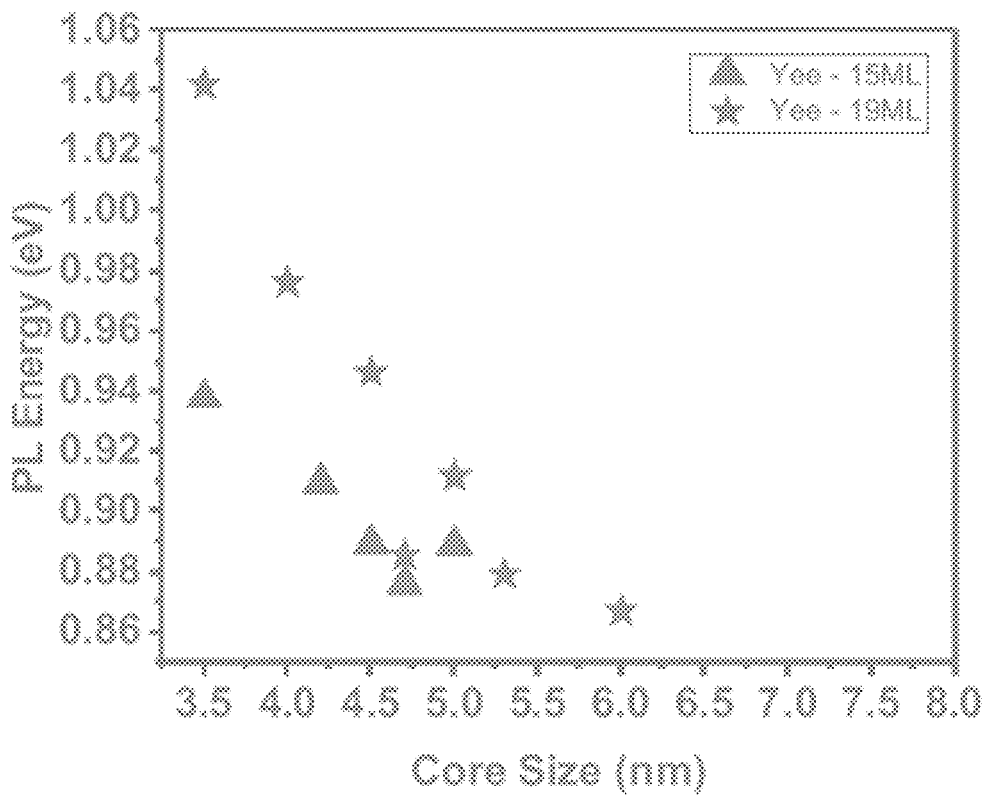
FIG. 14 is a graph illustrating photoluminescence (PL) energy as a function of the sizes of the pre-made Cu2-xS cores according to some embodiments of inventive concepts.

Changing the size of the pre-made $Cu_{2-x}S$ copper sulfide cores used for the reaction may also affect the band gap of the resulting Cu-doped PbS nanoparticles and/or the resulting core/shell $Cu_{2-x}S/PbS$ nanoparticles. FIG. 14 is a graph showing photoluminescence (PL) energy as a function of the sizes of the pre-made $Cu_{2-x}S$ cores used for the reaction for 15 ML reactions (designated with triangles and for 19 ML reactions (designated with stars).

Figure 5B:
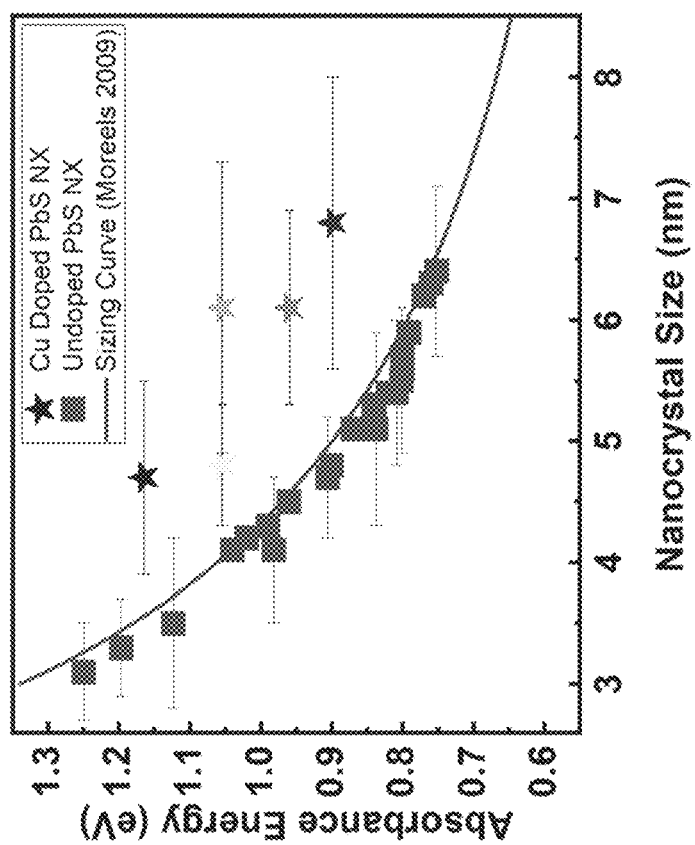
FIG. 5B is a graph illustrating photoluminescence energy as a function of nanocrystal size for undoped PbS nanocrystals (designated as squares) and for Cu-doped PbS nanocrystals (designated as stars) according to some embodiments of inventive concepts.
Figure 15:
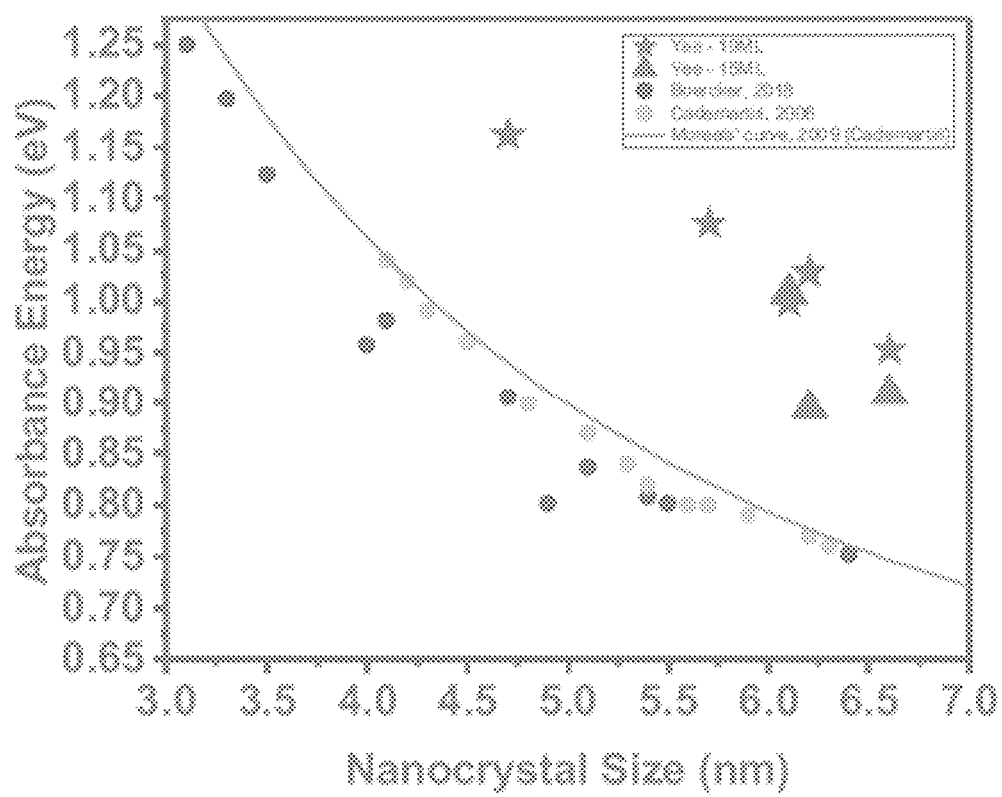
FIG. 15 is a graph illustrating absorbance energy as a function of nanocrystal size for undoped PbS nanocrystals formed using two different techniques (designated with light and dark circles), for Cu-doped PbS nanocrystals formed using 19 ML reactions (designated with stars) according to some embodiments of inventive concepts, and for Cu-doped PbS nanocrystals formed using 15 ML reactions (designated with triangles) according to some embodiments of inventive concepts.

FIG. 15 is a graph showing absorbance energy as a function of nanocrystal size for Cu-doped PbS nanocrystals formed using 19 ML reactions (designated with stars), for Cu-doped PbS nanocrystals formed using 15 ML reactions (designated with triangles), and for undoped PbS nanocrystals formed using two different techniques (designated with light and dark circles). The curve is taken from I. Moreels et al., "Size-Dependent Optical Properties of Colloidal PbSe Quantum Dots," ACS Nano 3, 3023 (2009) and is the sizing curve for undoped PbS nanocrystals. As shown in FIGS. 15 and 5B, Cu-doped PbS nanocrystals may lie off/above the sizing curve for undoped PbS.

Moreover, Cu-doped PbS nanocrystals according to some embodiments of present inventive concepts may have a Galena PbS crystal structure. In addition, these Cu-doped PbS nanocrystals may have shorter photoluminescence lifetimes as discussed with respect to FIG. 6A and faster radiative and non-radiative rates. For a 19 ML reaction on 3.5 nm $Cu_{2-x}S$ cores, 4.22 g of Pb-oleate was mixed with 4.1 mL of 1-octadecene in a 25 mL, three-necked, round bottom flask within a nitrogen $N_2$ glovebox. The 1-octadecene was previously dried by heating to 110° C. under vacuum for 3 hours and combining with activated 3 Å molecular sieves in a nitrogen glovebox. The mixture was removed from the glovebox and heated under argon to 60° C. The white Pb-oleate powder dissolved around 37° C. as the solution was heated, and a clear colorless solution was obtained. 1 mL of the $Cu_{2-x}S$ nanocrystal solution in hexane and 6.4 mL of the 0.57 M bis(trimethylsilyl)sulfide stock solution, both at room temperature, were injected simultaneously into the 60° C. Pb-oleate solution. The reaction was light brown to start, from the $Cu_{2-x}S$ cores, and slowly became darker as the reaction progressed because of the nucleation of PbS. At 6 minutes the reaction was quenched in an ethanol/acetone bath and brought back into the $N_2$ glovebox for purification.

For a 15ML reaction on 3.5 nm copper sulfide $Cu_{2-x}S$ cores, 2.47 g of Pb-oleate was mixed with 6.75 mL of 1-octadecene in a 25 mL, three-necked, round bottom flask within a nitrogen $N_2$ glovebox. The mixture was removed from the glovebox and heated under argon to 60° C. 1 mL of the copper sulfide $Cu_{2-x}S$ nanocrystal solution in hexane and 3.75 mL of 0.57 M bis(trimethylsilyl)sulfide stock solution, both at room temperature, were injected simultaneously into the 60° C. Pb-oleate solution. The reaction was light brown to start, from the copper sulfide $Cu_{2-x}S$ cores, and slowly became darker as the reaction progressed because of the nucleation of lead sulfide PbS. At 6 minutes the reaction was quenched in an ethanol/acetone bath and brought back into the glovebox for purification.

For a 21ML reaction on 5 nm copper sulfide $Cu_{2-x}S$ cores, 2.89 g of Pb-oleate was mixed with 6.1 mL of 1-octadecene in a 25 mL, three-necked, round bottom flask within a nitrogen $N_2$ glovebox. The mixture was removed from the glovebox and heated under argon to 70° C. 1 mL of the copper sulfide $Cu_{2-x}S$ core nanocrystal solution in heptane and 4.4 mL of 0.57 M bis(trimethylsilyl)sulfide stock solution, both at room temperature, were injected simultaneously into the 70° C. Pb-oleate solution. The reaction was light brown to start, from the copper sulfide $Cu_{2-x}S$ cores, and slowly became darker as the reaction progressed because of the nucleation of PbS. At 6 minutes the reaction was quenched in an ethanol/acetone bath and brought back into the glovebox for purification.

The Cu-doped PbS nanocrystals were purified from unreacted precursors, byproducts, and homogeneously nucleated PbS by mixing them with 30 mL of toluene and 22 mL of acetonitrile and centrifuging them at 6000 rpm for 5 minutes. This first cleaning step removed the majority of the unreacted precursors and byproducts; however, homogenously nucleated PbS nanocrystals remained. Because the size of the homogenously nucleated PbS was around 3 nm and the core/shell diameters were around 5-7 nm, they were separated from each other via size-selective precipitation using toluene and acetonitrile as the solvent/non-solvent pair. The precipitate from the first wash was added to 8 mL of toluene and 2.5 mL of acetonitrile (or until mixture was cloudy), and the mixture was centrifuged at 6000 rpm for 2 minutes. If the supernatant was completely clear, the wash was repeated using less acetonitrile. This process was repeated until no absorbance and photoluminescence from the homogenously nucleated PbS was detected. Bright-field transmission electron microscopy was also used to confirm that the homogeneous growth PbS nanocrystals had been removed.

Optical Characterization is discussed below.

Room temperature photoluminescence was measured using a Bruker Vertex 80v Fourier-transformed infrared (FTIR) spectrometer equipped with a UV-vis-NIR (ultraviolet, visible, near-infrared) calcium fluoride $CaF_2$ beam splitter and a Hamamatsu PbS/Si detector. The samples were excited with 190 mW from a 660 nm diode laser perpendicular to the collection axis. Absorbance spectra of the nanocrystals were obtained using a PerkinElmer Lambda 750 spectrometer equipped with PMT (photomultiplier tube) and PbS detectors, and deuterium and tungsten lamps. The nanocrystals were suspended in tetrachloroethylene (TCE).

For photoluminescence quantum yield (PLQY) measurements, the nanocrystals and IR-140 dye were suspended in TCE and 200 proof ethanol, respectively, at concentrations that resulted in 90±0.5% transmission at 660 nm to reduce/minimize reabsorption. In addition to the photoluminescence spectra taken of the nanocrystal and the IR-140 dye, which has a PLQY of 16.7±1%, the spectrum of a white light source was measured. This white light source has a known intensity vs energy profile that was measured using a spectroradiometer, Jacobian-corrected, and is used to determine the wavelength dependent calibration factors of the FTIR setup. The PLQY of the nanocrystals was calculated by multiplying the PLQY of the IR-140 dye (16.7±1%) by the ratio of the integrated photoluminescence of the nanocrystals to the integrated photoluminescence of the IR-140 dye.

Transmission Electron Microscopy (TEM) is discussed below.

TEM samples were created by drop casting a small volume (<40 µL) of dilute nanocrystal solutions in hexane onto lacey carbon TEM grids. A JEOL JEM-2200FS TEM operated at 200 kV was used to obtain bright-field images to measure the size distributions of the core and core/shell nanocrystals. The images were recorded on a Gatan OneView camera, which was calibrated with a MAG*I*CAL magnification reference sample. At least 100 nanocrystals were measured and averaged for each sample.

Scanning transmission electron microscopy (STEM) high-angle annular dark-field (HAADF) images and STEM energy-dispersive X-ray spectroscopy (STEM-EDS) spectrum images were obtained with the Nion UltraSTEM 200-X equipped with a Bruker windowless 0.7 sr, SDD (silicon drift detector) spectrometer. The UltraSTEM was operated at 60 kV with a nominal probe size of 0.120 nm, and probe current of 0.1 nA. The magnification calibrations for the HAADF images were checked against gold nanoparticle lattice spacings. The EDS (energy-dispersive X-ray) spectrum images were analyzed with the Bruker Espirit 1.93 software, using Cliff-Lorimer routines with calculated k factors. The STEM-EDS maps are provided with raw counts, using the Cu-L, S-Ka and Pb-La peaks.

X-ray Diffraction (XRD) Measurements are discussed below.

Powder XRD spectra were obtained using Cu Ka radiation ($\lambda$=1.54178 Angstroms Å) on a Rigaku Smartlab diffractometer equipped with a 9 kW rotating anode with a collimating mirror for quasi-Parallel-Beam (PB) geometry. A high sensitivity Si-strip line detector was used to collect the high signal to noise XRD spectra. Samples for XRD were prepared in a glovebox by drop casting concentrated nanocrystal solutions in chloroform onto Si (100) substrates. A combination of offsetting phi by 1-2 degrees and changing the substrate orientation on the sample chuck was used to reduce/minimize the appearance of forbidden Si (100) peaks, which can appear due to multiple reflections. Collected XRD spectra were background subtracted using the Rigaku PDXL (Integrated X-Ray Powder Diffraction) software package.

Operation and Use are discussed below.

Figure 1B:
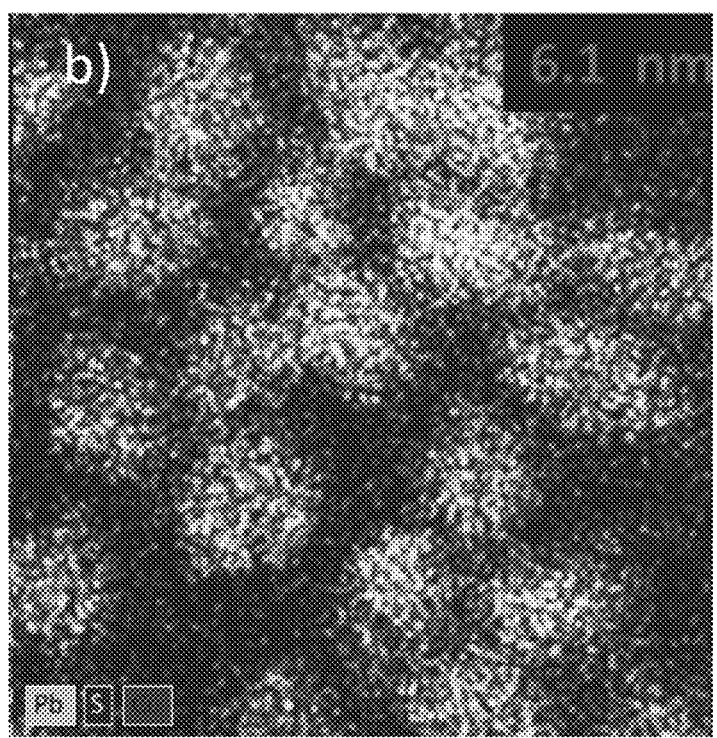
FIG. 1B is a STEM-EDS map of Cu-doped PbS nanocrystals made using a 15 ML precursor concentration on 3.5 nm copper sulfide $Cu_{2-x}S$ cores resulting in 6.1 nm Cu-doped nanocrystals with a Cu:Pb atomic ratio of 0.045 according to some embodiments of inventive concepts.
Figure 1C:
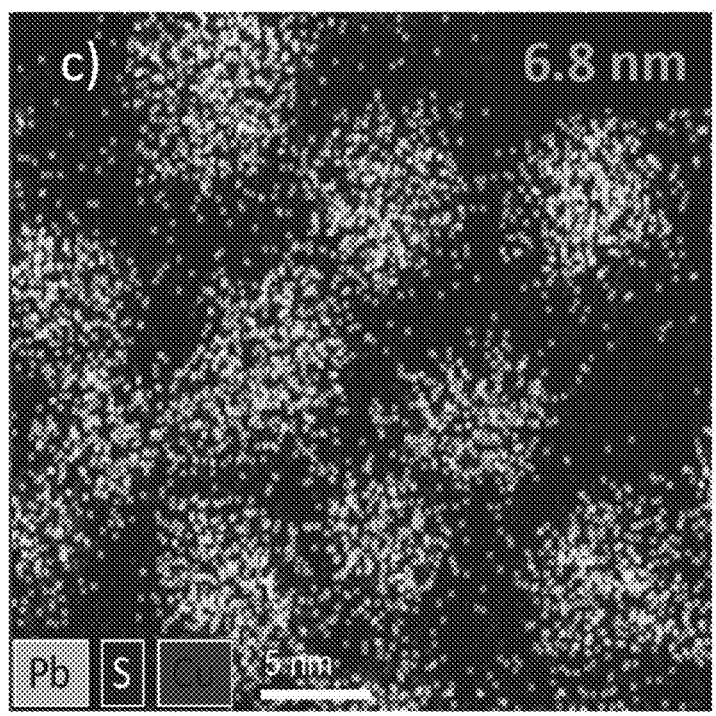
FIG. 1C is STEM-EDS map of Cu-doped PbS nanocrystals made using a 21 ML precursor concentration on 5.0 nm copper sulfide $Cu_{2-x}S$ cores resulting in 6.8 nm Cu-doped nanocrystals with a Cu:Pb atomic ratio of 0.034 according to some embodiments of inventive concepts.

FIGS. 1A, 1B, and 1C are energy-dispersive x-ray spectroscopy (EDS) maps of Cu-doped PbS nanocrystals made using various sized copper sulfide $Cu_{2-x}S$ cores and lead Pb and sulfur S precursor concentrations giving rise to different diameters and copper Cu concentrations in the resulting Cu-doped PbS nanocrystals. In FIG. 1A, a 19 monolayer (ML) precursor concentration was used with 3.5 nm copper sulfide $Cu_{2-x}S$ cores to provide 4.7 nm Cu-doped nanocrystals with a Cu:Pb atomic ratio of 0.005. In FIG. 1B, a 15 ML precursor concentration was used with 3.5 nm copper sulfide $Cu_{2-x}S$ cores to provide 6.1 nm Cu-doped nanocrystals with a Cu:Pb atomic ratio of 0.045. In FIG. 1C, a 21 ML precursor concentration was used with 5.0 nm copper sulfide $Cu_{2-x}S$ cores to provide 6.8 nm Cu-doped nanocrystals with a Cu:Pb atomic ratio of 0.034.

This is the first demonstration of Cu-doped PbS nanocrystals with blue shifted emission relative to undoped PbS nanocrystals known to the inventors of the present disclosure. FIGS. 1A, 1B, and 1C show that these nanocrystals may have uniform concentrations of Pb, S, and Cu throughout the nanocrystals, with the nanocrystal being mostly Pb and S with a much smaller concentration of Cu doped throughout the nanocrystals. Inductively coupled plasmonic optical emission spectroscopy (ICP-OES) measurements of the Cu:Pb ratio in these nanocrystals is noted on the images in FIGS. 1A, 1B, and 1C. FIGS. 1A, 1B, and 1C demonstrate that Cu-doped PbS nanocrystals are provided with the Cu being evenly distributed inside the nanocrystals.

Figure 2:
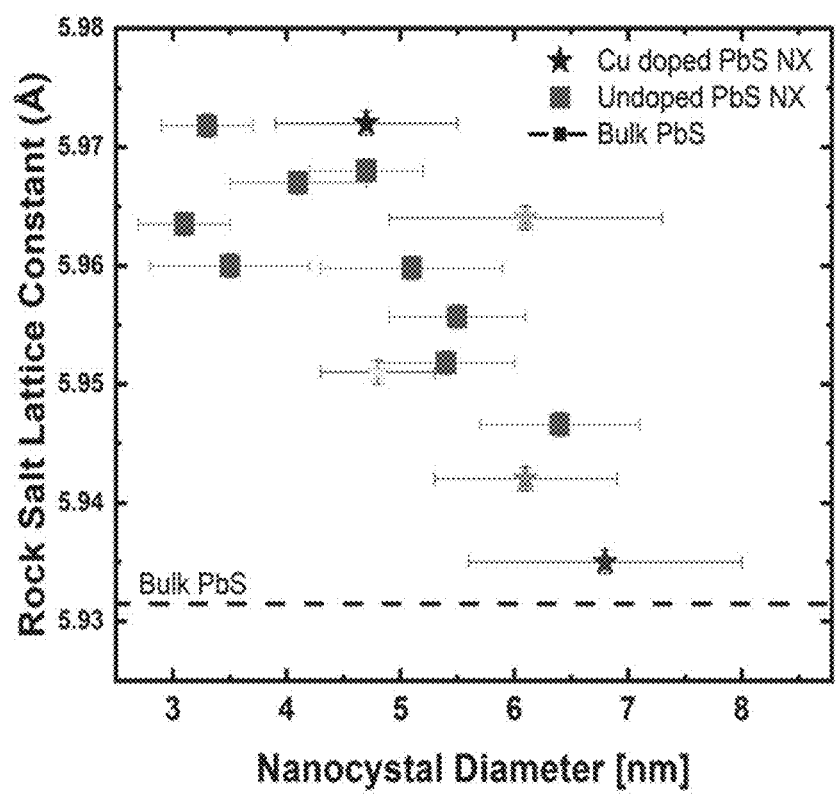
FIG. 2 is a graph illustrating rock salt lattice constants as a function of nanoparticle size for undoped lead sulfide PbS (designated with squares) and copper Cu doped lead sulfide PbS nanocrystals (designated with stars) according to some embodiments of inventive concepts.

FIG. 2 is a graph illustrating rock salt lattice constants of undoped lead sulfide PbS nanocrystals (designated as squares) and rock salt lattice constants of Cu-doped lead sulfide PbS nanocrystals (designated as stars). As shown in FIG. 2, lattice constants of Cu-doped PbS are similar (within error) to that of undoped nanocrystals at the same/similar nanoparticle sizes.

Figure 3A:
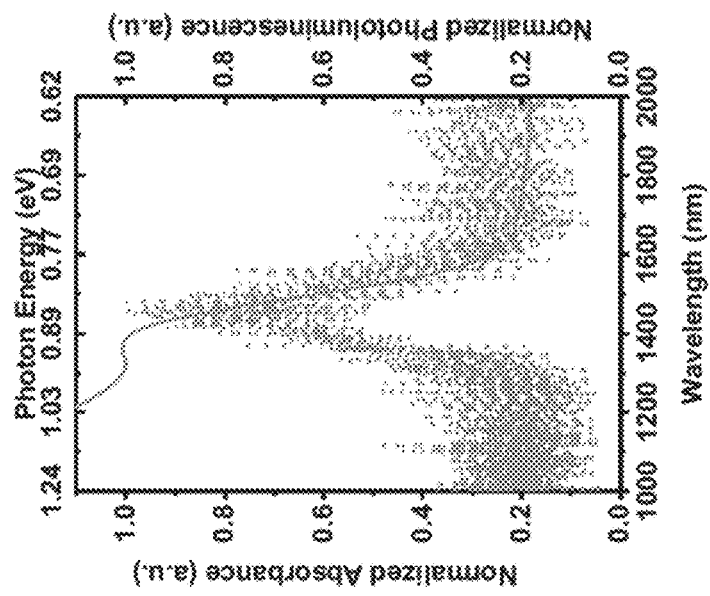
FIG. 3A is a graph illustrating absorbance as a function of wavelength (solid line) and photoluminescence as a function of wavelength (dotted line) for the nanocrystals of FIG. 1A according to some embodiments of inventive concepts.
Figure 3B:
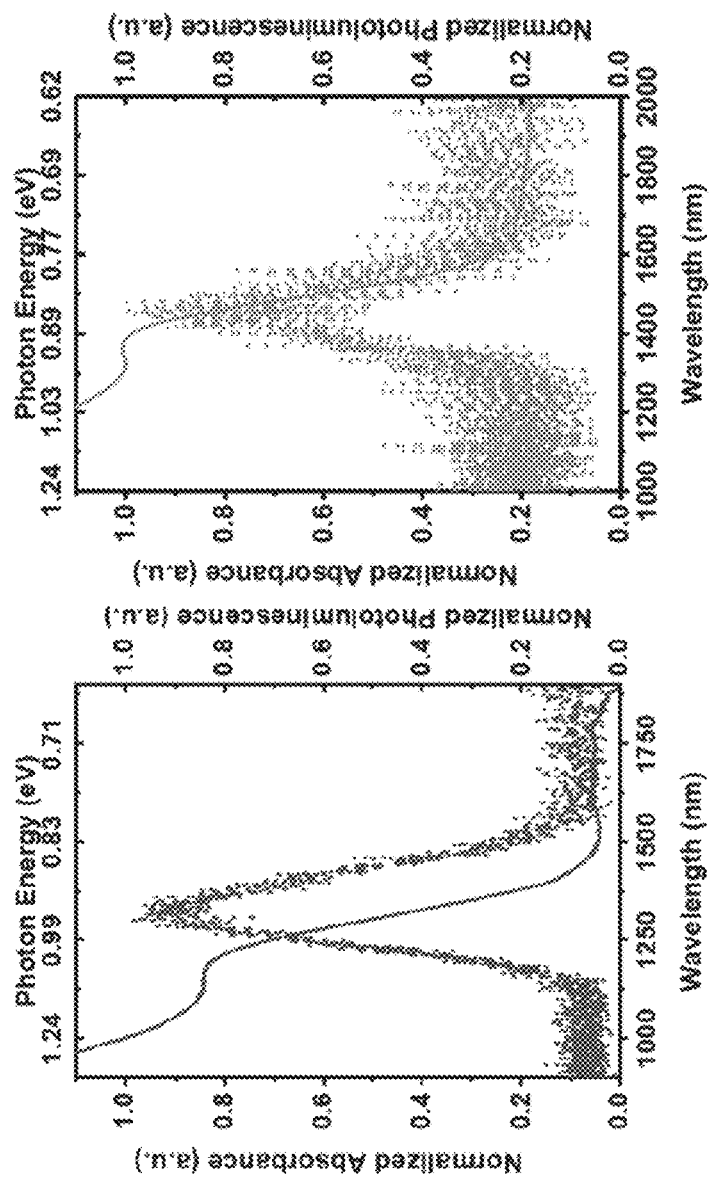
FIG. 3B is a graph illustrating absorbance as a function of wavelength (solid line) and photoluminescence as a function of wavelength (dotted line) for the nanocrystals of FIG. 1B according to some embodiments of inventive concepts.
Figure 3C:
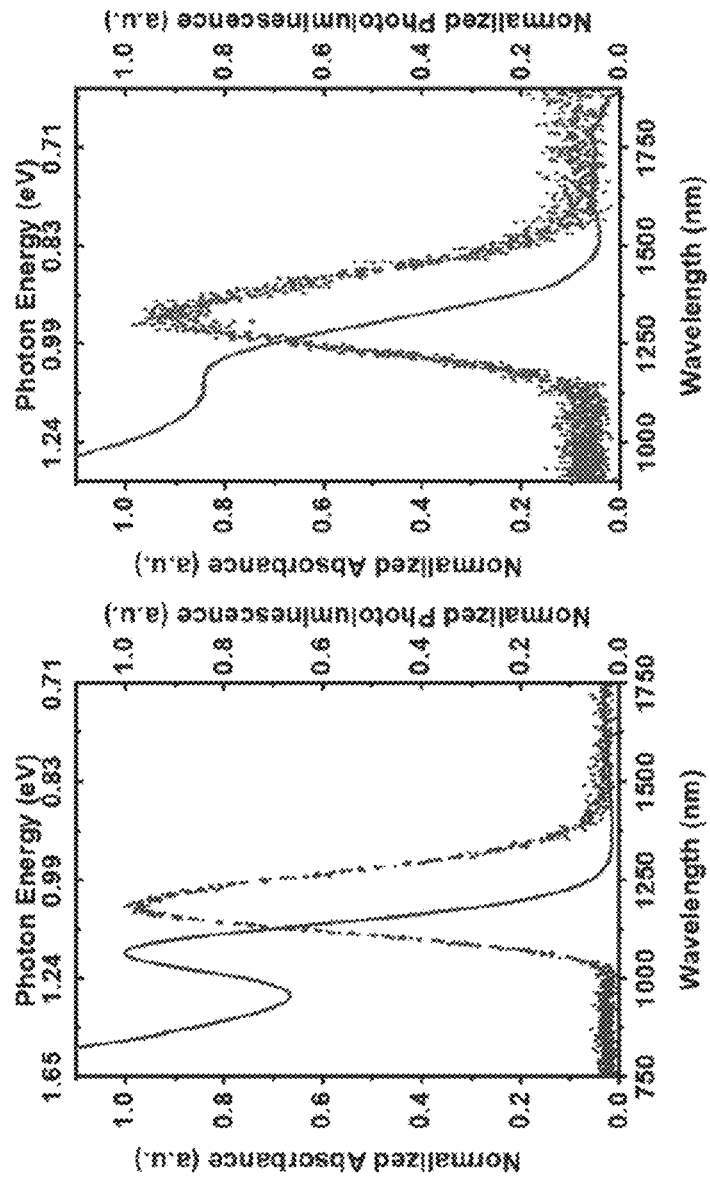
FIG. 3C is a graph illustrating absorbance as a function of wavelength (solid line) and photoluminescence as a function of wavelength (dotted line) for the nanocrystals of FIG. 1C according to some embodiments of inventive concepts.

FIGS. 3A, 3B, and 3C illustrate absorbances and photoluminescences from the three different batches of the Cu-doped PbS nanocrystals with the different diameters and Cu-dopant concentrations discussed above with respect to FIGS. 1A, 1B, and 1C. In FIG. 3A, Cu-doped PbS nanocrystals were formed using the 19 ML precursor concentrations with 3.5 nm copper sulfide $Cu_{2-x}S$ cores to provide 4.7 nm Cu-doped nanocrystals with a Cu:Pb atomic ratio of 0.005 as discussed above with respect to FIG. 1A. In FIG. 3B, Cu-doped PbS nanocrystals were formed using the 15 ML precursor concentrations with 3.5 nm copper sulfide $Cu_{2-x}S$ cores to provide 6.1 nm Cu-doped PbS nanocrystals with a Cu:Pb atomic ratio of 0.045 as discussed above with respect to FIG. 1B. In FIG. 3C, Cu-doped PbS nanocrystals were formed using the 21 ML precursor concentrations with 5.0 nm copper sulfide $Cu_{2-x}S$ cores to provide 6.8 nm Cu-doped PbS nanocrystals with a Cu:Pb atomic ratio of 0.034, as discussed above with respect to FIG. 1C.

Figure 4A:
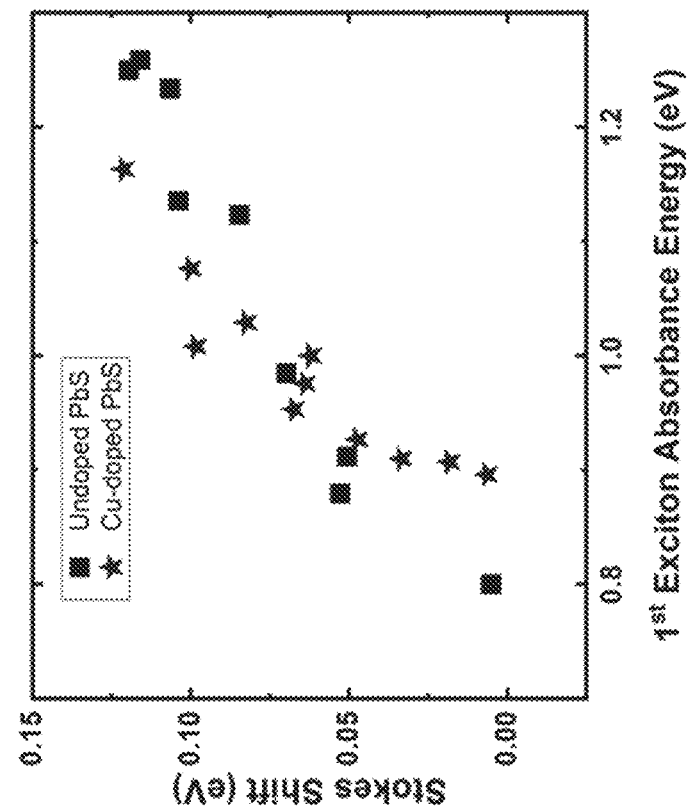
FIG. 4A is a graph illustrating photoluminescence peak full-width half max (FWHM) as a function of $1^{st}$ exciton emission energy for undoped lead sulfide nanocrystals (designated with squares) and for copper Cu doped lead sulfide PbS nanocrystals (designated with stars) according to some embodiments of inventive concepts.
Figure 4B:
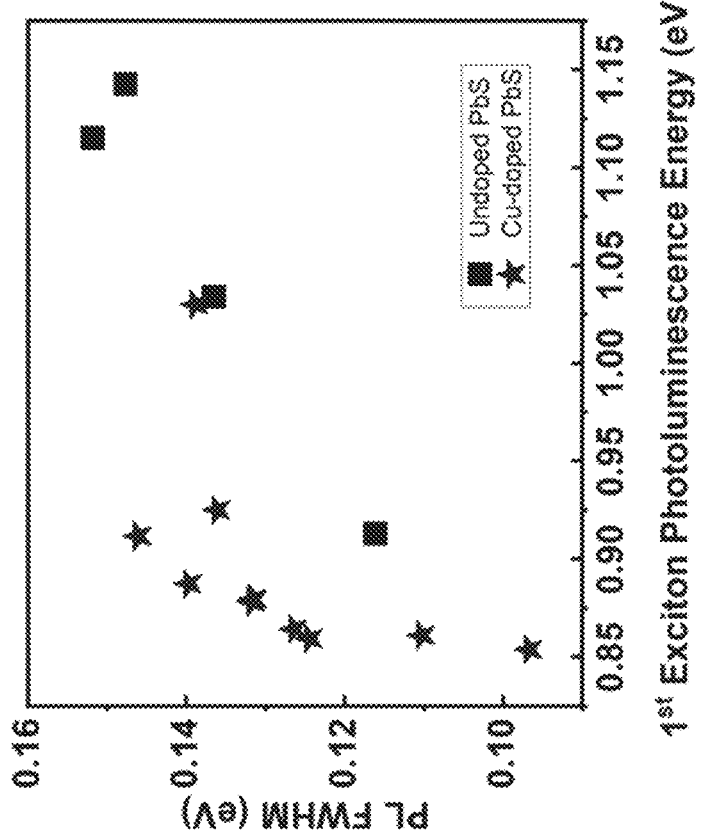
FIG. 4B is a graph illustrating Stokes shift as a function of $1^{st}$ exciton absorbance energy for undoped lead sulfide nanocrystals (designated with squares) and for copper Cu doped lead sulfide PbS nanocrystals (designated with stars) according to some embodiments of inventive concepts.

FIG. 4A is a graph illustrating photoluminescence peak full-width half maximum (FWHM) as a function of $1^{st}$ exciton emission energy for undoped PbS nanocrystals (designated as squares) and for Cu-doped PbS nanocrystals (designated as stars). FIG. 4B is a graph illustrating Stokes shift as a function of $1^{st}$ exciton absorbance energy for PbS nanocrystals (designated as squares) and Cu-doped PbS nanocrystals (designated as stars). The first exciton peaks for the Cu-doped nanocrystals have similar Full Width Half Maximum (FWHM) values and Stokes shifts as compared to undoped PbS as shown in FIGS. 4A and 4B. The FWHM values are in the range of about 100 to about 150 meV, which may be much less than the FWHM seen from the emission from Cu-doped II-VI and III-V nanocrystals.

Figure 5A:
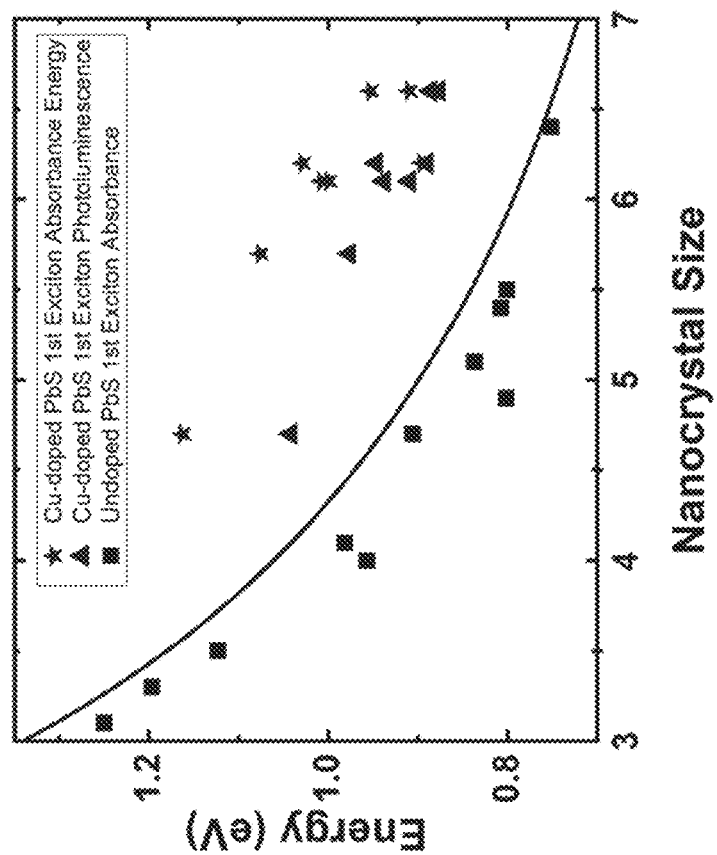
FIG. 5A is a graph illustrating $1^{st}$ exciton absorbance energy as a function of nanocrystal size for undoped lead sulfide PbS nanocrystals (designated with squares), illustrating $1^{st}$ exciton absorbance energy as a function of nanocrystal size for copper Cu doped lead sulfide PbS nanocrystals (designated with stars) according to some embodiments of inventive concepts, and illustrating $1^{st}$ exciton absorbance energy as a function of nanocrystal size for copper Cu doped lead sulfide PbS nanocrystals (designated with stars) according to some embodiments of inventive concepts.

FIG. 5A is a graph illustrating a $1^{st}$ exciton absorbance energy sizing curve for undoped PbS nanocrystals (designated as squares), a $1^{st}$ exciton absorbance energy sizing curve for Cu-doped PbS nanocrystals (designated as stars), and a $1^{st}$ exciton photoluminescence sizing curve for Cu-doped PbS nanocrystals (designated as triangles). FIG. 5A shows that the absorbance and photoluminescence sizing curves for Cu-doped PbS nanocrystals are blue shifted by about ~200 meV as compared to undoped PbS nanocrystals. FIG. 5B is a graph illustrating photoluminescence energy as a function of nanocrystal size for undoped PbS nanocrystals (designated as squares) and for Cu-doped PbS nanocrystals (designated as stars). As shown in FIG. 5B, Cu-doping blueshifts the exciton energy of PbS nanocrystals which may increase their tunability in optoelectronic applications by decoupling the nanocrystal size from the exciton energy. Note that even with the large size distribution of the Cu-doped nanocrystals, seen as the horizontal error bars in FIG. 5B, the blueshift is valid.

FIGS. 3A-C, 4A-B, and 5A-B demonstrate that the Cu-doped PbS nanocrystals according to some embodiments of present inventive concepts may have unique optical properties that are different than previously discovered Cu-doped nanocrystals, since the first exciton peak is blue shifted (rather than redshifted) upon Cu-doping and the FWHM and Stokes shifts of the doped and undoped nanocrystals remain the same as opposed to increasing upon Cu-doping.

Figure 6A:
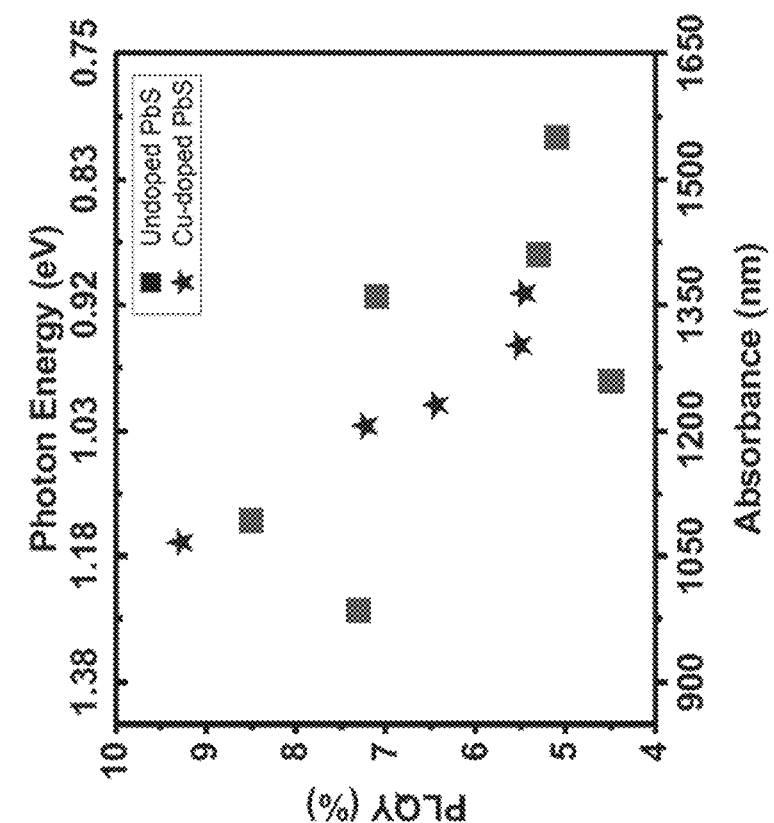
FIG. 6A is a graph illustrating photoluminescence lifetime as a function of $1^{st}$ exciton absorbance energy for undoped PbS (designated with squares) and for Cu-doped PbS according to some embodiments of inventive concepts.
Figure 6B:
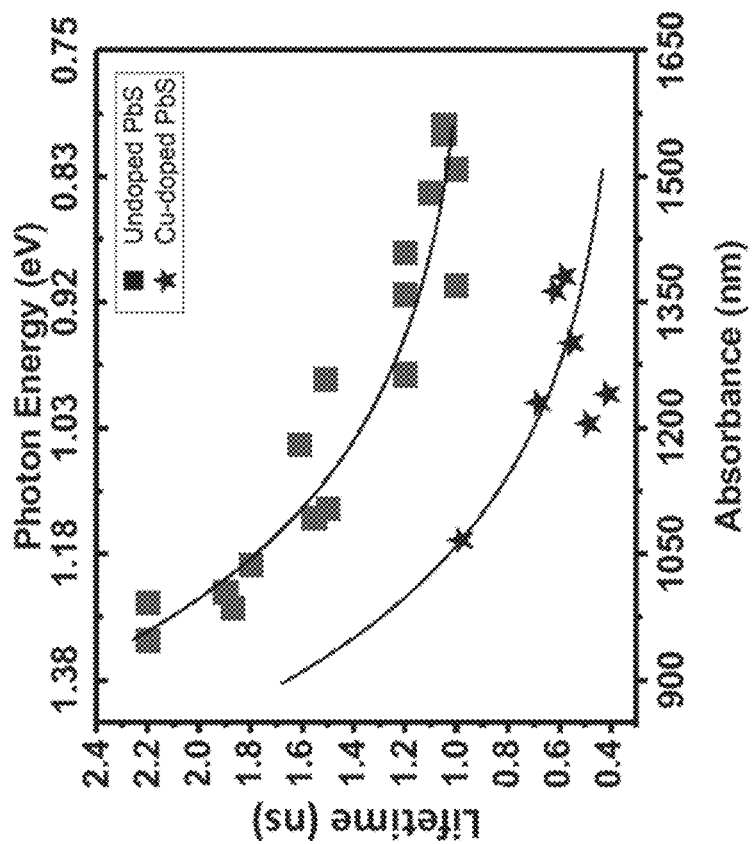
FIG. 6B is a graph illustrating photoluminescence quantum yield (PLQY) as a function of $1^{st}$ exciton absorbance energy for undoped PbS (designated with squares) and for copper Cu doped PbS according to some embodiments of inventive concepts.
Figure 6C:
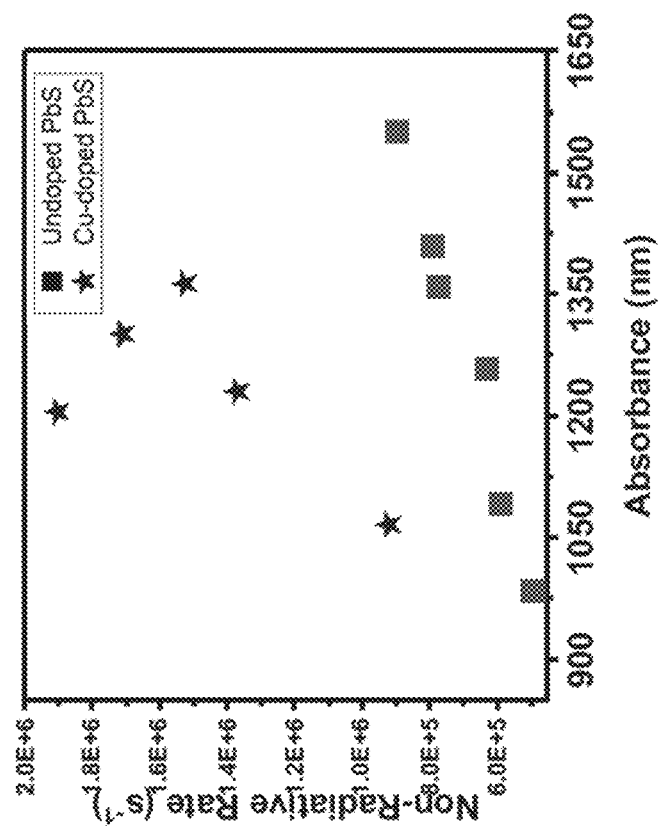
FIG. 6C is a graph illustrating radiative rate as a function of 1st exciton absorbance energy for undoped PbS (designated with squares) and for copper Cu doped PbS according to some embodiments of inventive concepts.
Figure 6D:
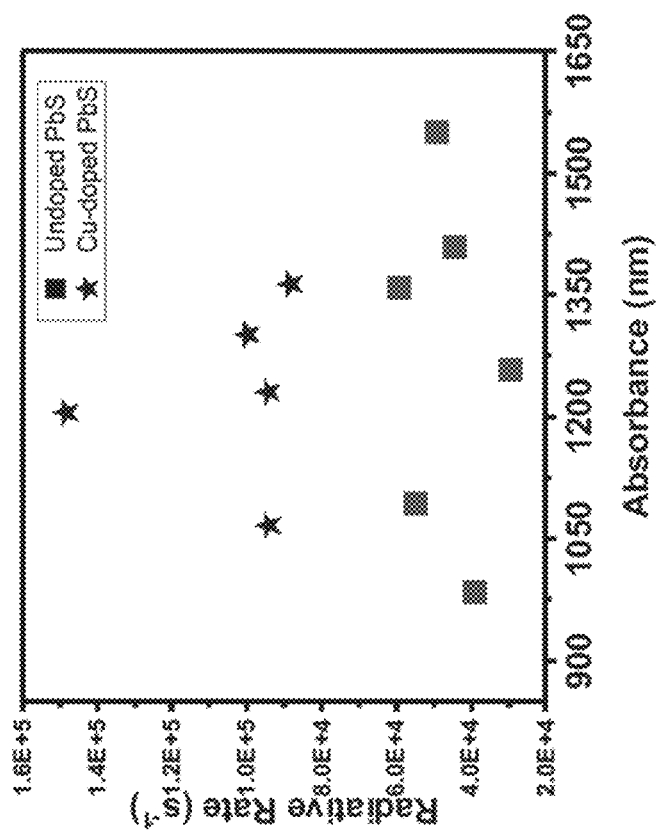
FIG. 6D is a graph illustrating non-radiative rate as a function of $1^{st}$ exciton absorbance energy for undoped PbS (designated with squares) and for copper Cu doped PbS according to some embodiments of inventive concepts.

FIG. 6A is a graph illustrating photoluminescence lifetimes as a function of $1^{st}$ exciton absorbance energy for undoped PbS nanocrystals (designated as squares) and for Cu-doped PbS nanocrystals (designated as stars). FIG. 6B is a graph illustrating photoluminescence quantum yields as a function of $1^{st}$ exciton absorbance energy for undoped PbS nanocrystals (designated as squares) and for Cu-doped PbS nanocrystals (designated as stars). FIG. 6C is a graph illustrating radiative rates as a function of $1^{st}$ exciton absorbance energy for undoped PbS nanocrystals (designated as squares) and for Cu-doped PbS nanocrystals (designated as stars). FIG. 6D is a graph illustrating non-radiative rates as a function of $1^{st}$ exciton absorbance energy for undoped PbS nanocrystals (designated as squares) and for Cu-doped PbS nanocrystals (designated as stars).

FIG. 6A shows that Cu-doped PbS nanocrystals are different than other Cu-doped semiconductor nanocrystals because they have an emission/exciton lifetime (t) on the order about 400 to about 1000 ns as opposed to the 50 to 500 ns lifetimes seen in Cu-doped II-VI and III-V nanocrystals. The formula for Photoluminescence Quantum Yield (PLQY) is given as:

$$PLQY = k_r * t$$

Emission/exciton lifetimes (t) are thus shorter for Cu-doped PbS nanocrystals as compared to undoped PbS nanocrystals. Therefore, radiative rates ($k_r$) are faster in Cu-doped PbS nanocrystals as compared to undoped PbS nanocrystals.

FIG. 6B shows that the addition of copper atoms to the PbS nanocrystals does not significantly lower photoluminescence.

FIGS. 6C and 6D demonstrate that Cu-doped PbS nanocrystals according to some embodiments of present inventive concepts may have radiative rates that are up to 10 times faster than radiative rates of undoped PbS nanocrystals, making Cu-doped PbS nanocrystals highly attractive for single-photon emitters in the telecommunications energy window. For example, radiative rates for Cu-doped PbS nanocrystals may increase in the range of about 1.9 to about 3.3 times relative to that of undoped PbS nanocrystals making these Cu-doped PbS nanocrystals potentially brighter for single-photon emitters, and non-radiative rates for Cu-doped PbS nanocrystals may increase in the range of about 1.7 to about 2.9 times that of undoped PbS nanocrystals. Moreover, Cu-doping may blueshift the exciton energy of the Cu-doped PbS which may decouple the exciton energy from the nanocrystal size making them more attractive for infrared optoelectronics. According to some embodiments of present inventive concepts, Cu-doped PbS nanocrystals may have a photoluminescence quantum yield that is similar/equal to that of an undoped PbS nanocrystal, but with a radiative rate that is 10 times faster. This may be useful for room-temperature, reduced size, reduced weight, reduced power, reduced cost and/or brighter single-photon emitters that are used at telecommunications wavelengths for quantum technologies such as quantum communications, quantum sensing, and/or quantum metrology. These Cu-doped PbS nanocrystals, for example, may be useful for quantum sensing and/or metrology devices used in unmanned aerial vehicles and/or satellites, and/or for quantum-dot-enhanced infrared focal plan array imagers and/or chemical sensors. These Cu-doped PbS nanocrystals may also be useful to improve performance of colloidal nanocrystal optoelectronic devices, for example, providing more tunability of structural property relationships.

According to some embodiments of present inventive concepts, Cu-doped PbS nanocrystals may allow for emission tuning that is decoupled from size and quantum confinement, thereby increasing the tunability of the absorption and emission energies which may facilitate novel/improved emissive and/or absorptive devices.

According to some embodiments of present inventive concepts, PbS nanocrystals may thus be doped with copper atoms to increase radiative rates of the Cu-doped PbS nanocrystals and to decouple the nanocrystal size and exciton energy by blueshifting the exciton.

Cu-doped PbS nanocyrstals according to some embodiments of inventive concepts may thus provide tunable size and/or optical properties that facilitate incorporation into optoelectronic applications such as quantum dot light emitting diodes for flat screen displays (such as QLED television displays), solar cells, and/or short-wave infrared cameras. For flat screen displays, Cu-doped PbS nanocyrstals may provide quantum light emitting diodes with increased photoluminescence quantum yields and/or narrow photoluminescence line widths to generate more precise and/or brighter infrared emission. For solar cells, Cu-doped PbS nanocyrstals may provide increased power conversion efficiencies, more highly tunable band gaps, and/or reduced cost processing. For short-wave infrared cameras, Cu-doped PbS nanocyrstals may provide improved external quantum efficiencies and/or photostability to provide improved direct readout integrated circuit (ROIC) sensors with increased resolution and/or lower production cost.

Figure 16:
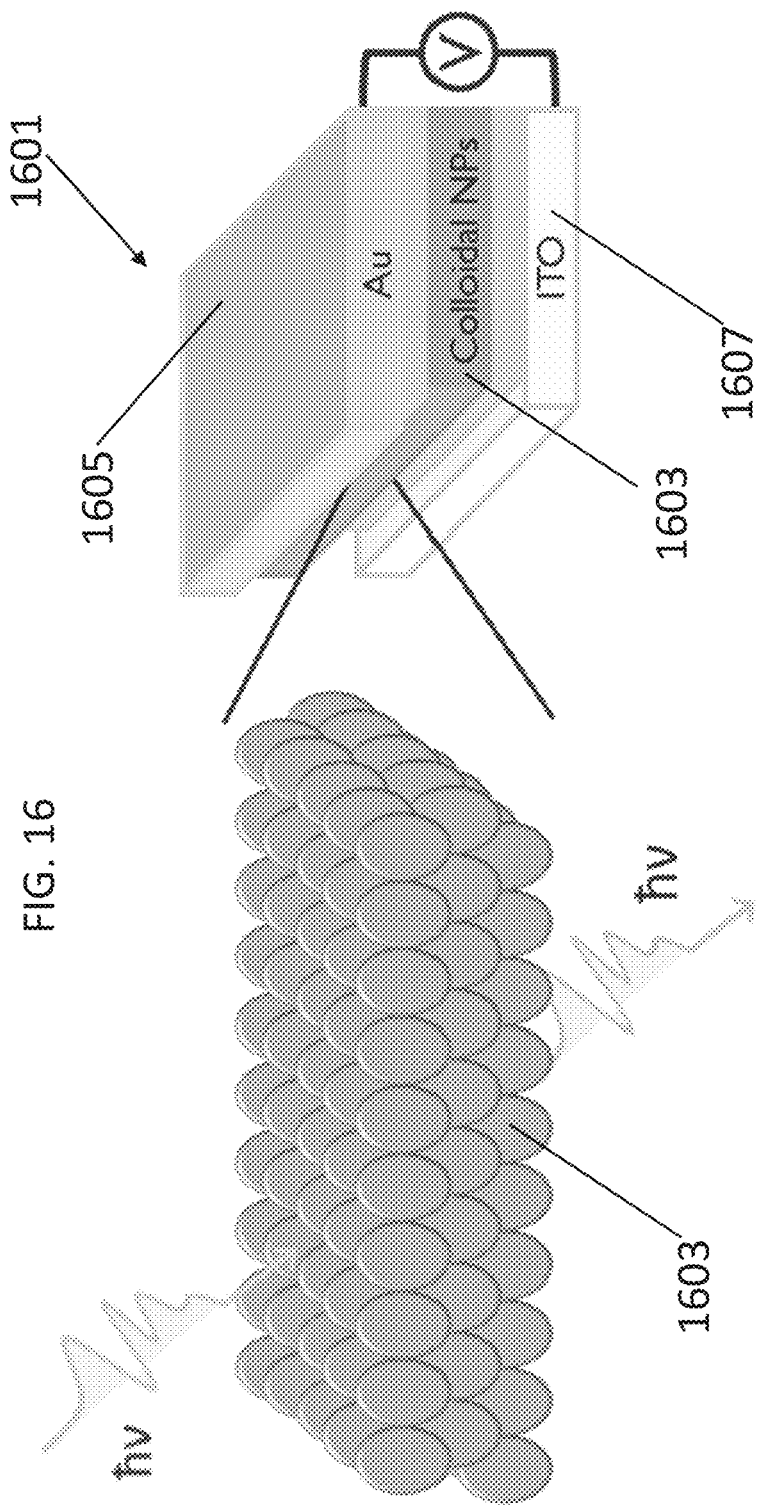
FIG. 16 is a diagram illustrating a nanocrystal device including a colloidal nanocrystal layer according to some embodiments of inventive concepts.

The colloidal nanocrystal device 1601 of FIG. 16 includes a colloidal nanocrystal layer 1603 (made up of a superlattice of nanocrystals, also referred to as nanoparticles NPs) between gold (Au) and Indium Tin Oxide (ITO) electrodes 1605 and 1607. When used as an absorptive device (such as for solar cell or camera sensor), light incident on the colloidal nanocrystal layer 1603 may be used to generate an electrical signal (such as a voltage V) between electrodes 1605 and 1607. When used as an emissive device (such as a quantum dot light emitting diode of a flat screen display), an electrical signal (e.g., a voltage V) may be applied across electrodes 1605 and 1607 to generate light.

Figure 17:
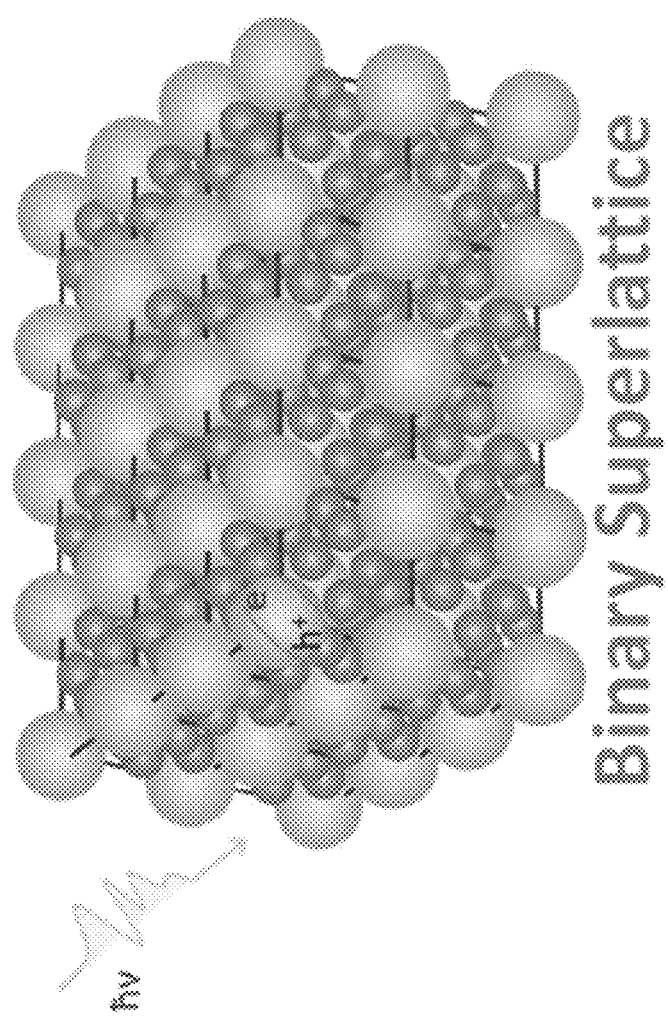
FIG. 17 is a diagram illustrating a colloidal nanocrystal layer including semiconductor excitonic nanocrystals and plasmonic nanocrystals according to some embodiments of inventive concepts.

Moreover, the colloidal nanocrystal layer 1603 may be implemented using a hybrid nanostructure such as the binary superlattice of FIG. 17 comprising semiconductor excitonic nanocrystals and plasmonic nanocrystals to provide improved optical properties (e.g., increased absorption cross-section, and/or faster radiative recombination) resulting from exciton-plasmon coupling. By way of example, plasmonic nanocrystals of the binary superlattice may be provided using copper sulfide $Cu_{2-x}S$ nanocrystals or core/shell $Cu_{2-x}S$/PbS nanocrystals with a copper sulfide core and a lead sulfide shell as discussed in U.S. patent application Ser. No. 17/238,265. Moreover, excitonic nanocrystals of the binary superlattice may be provided using Cu-doped lead sulfide PbS nanocrystals as disclosed herein.

According to some embodiments of inventive concepts, $Cu_{2-x}S$/PbS core/shell nanoparticles/nanocrystals may be synthesized with improved chemical stability, which may be useful for controlled studies of exciton-plasmon coupling in binary superlattices. By increasing a concentration of a lead precursor (e.g., Pb-oleate) used in the reaction, Cu-doped PbS nanocrystals may be produced to provide a new excitonic species that lies off the PbS sizing curve. Moreover, the reaction used to form $Cu_{2-x}S$/PbS core/shell nanoparticles/ nanocrystals and/or Cu-doped PbS nanoparticles/nanocrystals may be controlled based on size of the pre-made copper sulfide cores and/or based on concentration of the lead precursor to tune/adjust resulting populations of excitonic and plasmonic nanoparticles/nanocrystals that can be used to form a binary superlattice.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. The term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present inventive concepts.

It will also be understood that when an element is referred to as being "on" or "connected to" another element, it can be directly on or connected to the other element, or intervening elements may be present. In contrast, when an element is referred to as being "directly on" or "directly connected to" another element, there are no intervening elements present. Moreover, if an element is referred to as being "on" another element, no spatial orientation is implied such that the element can be over the other element, under the other element, on a side of the other element, etc.

Unless otherwise defined, all terms (including technical and scientific terms) used herein have the same meaning as commonly understood by one of ordinary skill in the art to which the inventive concepts herein belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While inventive concepts have been particularly shown and described with reference to examples of embodiments thereof, it will be understood that various changes in form and details may be made therein without departing from the spirit of the following claims.

The invention claimed is:

1. A method of fabricating nanocrystals, the method comprising:
   providing copper sulfide core nanocrystals;
   providing a lead precursor; and
   reacting the copper sulfide core nanocrystals with the lead precursor to generate copper doped lead sulfide nanocrystals.

2. The method according to claim 1, wherein the lead precursor comprises lead oleate.

3. The method according to claim 1, further comprising:
   providing a sulfur precursor;
   wherein reacting comprises reacting the copper sulfide core nanocrystals, the sulfur precursor, and the lead precursor to generate the copper doped lead sulfide nanocrystals.

4. The method according to claim 3, wherein the sulfur precursor comprises bis(trimethylsilyl)sulfide.

5. The method according to claim 1, wherein reacting comprises performing a cation exchange reaction to exchange the copper atoms in the copper sulfide core nanocrystal for lead atoms of the lead precursor.

6. The method according to claim 5, wherein the cation exchange reaction is performed using flash-injection synthesis to generate the copper doped lead sulfide nanocrystals.

7. The method according to claim 1, wherein reacting comprises reacting a first plurality of the copper sulfide core nanocrystals with the lead precursor to generate the copper doped lead sulfide nanocrystals and reacting a second plurality of the copper sulfide nanocrystals with the lead precursor to generate core/shell nanocrystals, wherein each of the core/shell nanocrystals includes a copper sulfide core and a lead sulfide shell surrounding the copper sulfide core.

8. The method according to claim 1, wherein the copper doped lead sulfide nanocrystals have uniform concentrations of lead, sulfur, and copper throughout the copper doped lead sulfide nanocrystals.

9. The method according to claim 1, wherein the copper doped lead sulfide nanocrystals have lattice constants in the range of about 5.95 Angstroms to about 5.99 Angstroms.

10. The method according to claim 1, wherein the copper doped lead sulfide nanocrystals provide photoemission with a wavelength in the range of about 1330 nm to about 1550 nm.

11. The method according to claim 1, wherein the copper doped lead sulfide nanocrystals have sizes in the range of 4.5 nm to about 7.5 nm.

12. The method according to claim 1, wherein the copper doped lead sulfide nanocrystals have atomic ratios of Cu:Pb in the range of about 0.005 to about 0.045.

13. A copper doped lead sulfide crystal providing photoemission with a wavelength in the range of 1330 nm to 1550 nm, wherein the copper doped lead sulfide crystal has uniform concentrations of lead, sulfur, and copper throughout the copper doped lead sulfide crystal.

14. The copper doped lead sulfide crystal according to claim 13, wherein the copper doped lead sulfide crystal has an atomic ratio of Cu:Pb in the range of about 0.005 to about 0.045.

15. The copper doped lead sulfide crystal according to claim 13, wherein the copper doped lead sulfide crystal has a lattice constant in the range of about 5.95 Angstroms to about 5.99 Angstroms.

16. A copper doped lead sulfide crystal providing photoemission with a wavelength in the range of 1330 nm to 1550 nm, wherein the copper doped lead sulfide crystal is a copper doped lead sulfide nanocrystal having a size in a range of 4.5 nm to about 7.5 nm.

17. The copper doped lead sulfide crystal according to claim 16, wherein the copper doped lead sulfide crystal has uniform concentrations of lead, sulfur, and copper throughout the copper doped lead sulfide crystal.

18. An optoelectronic device comprising:
a first electrode;
a colloidal nanocrystal layer on the first electrode, wherein the colloidal nanocrystal layer comprises copper doped lead sulfide nanocrystals; and
a second electrode on the colloidal nanocrystal layer so that the colloidal nanocrystal layer is between the first and second electrodes.

19. The optoelectronic device according to claim 18, wherein the copper doped lead sulfide nanocrystals have sizes in a range of 4.5 nm to about 7.5 nm.

20. The optoelectronic device according to claim 18, wherein the copper doped lead sulfide nanocrystals have lattice constants in the range of about 5.95 Angstroms to about 5.99 Angstroms.

21. The optoelectronic device according to claim 18, wherein the copper doped lead sulfide nanocrystals have atomic ratios of Cu:Pb in the range of about 0.005 to about 0.045.

22. The optoelectronic device according to claim 18, wherein the copper doped lead sulfide nanocrystals provide photon-emission with a wavelength in the range of about 1330 nm to about 1550 nm.

23. An optoelectronic device comprising:
a first electrode;
a nanocrystal layer on the first electrode, wherein the nanocrystal layer comprises copper doped lead sulfide nanocrystals and core/shell nanocrystals, wherein each of the core/shell nanocrystals includes a copper sulfide core and a lead sulfide shell surrounding the copper sulfide core; and
a second electrode on the nanocrystal layer so that the nanocrystal layer is between the first and second electrodes.

24. The optoelectronic device according to claim 23, wherein the nanocrystal layer comprises a colloidal nanocrystal layer.

25. The optoelectronic device according to claim 23, wherein the nanocrystal layer comprises a superlattice including the copper doped lead sulfide nanocrystals and the core/shell nanocrystals.

26. An optoelectronic device comprising:
a first electrode;
a nanocrystal layer on the first electrode, wherein the nanocrystal layer comprises copper doped lead sulfide nanocrystals, wherein the copper doped lead sulfide nanocrystals have uniform concentrations of lead, sulfur, and copper throughout the copper doped lead sulfide nanocrystals; and
a second electrode on the nanocrystal layer so that the nanocrystal layer is between the first and second electrodes.

* * * * *